United States Patent
Kohno

(10) Patent No.: US 11,251,016 B2
(45) Date of Patent: Feb. 15, 2022

(54) METHOD OF CONTROLLING TRANSMISSION ELECTRON MICROSCOPE AND TRANSMISSION ELECTRON MICROSCOPE

(71) Applicant: JEOL Ltd., Tokyo (JP)

(72) Inventor: Yuji Kohno, Tokyo (JP)

(73) Assignee: JEOL Ltd., Tokyo (JP)

( * ) Notice: Subject to any disclaimer, the term of this patent is extended or adjusted under 35 U.S.C. 154(b) by 54 days.

(21) Appl. No.: 16/828,330

(22) Filed: Mar. 24, 2020

(65) Prior Publication Data

US 2020/0312612 A1    Oct. 1, 2020

(30) Foreign Application Priority Data

Mar. 28, 2019 (JP) .............................. JP2019-063461

(51) Int. Cl.
*H01J 37/141* (2006.01)
*H01J 37/26* (2006.01)
*H01J 37/295* (2006.01)

(52) U.S. Cl.
CPC .......... *H01J 37/268* (2013.01); *H01J 37/141* (2013.01); *H01J 37/295* (2013.01); *H01J 2237/04922* (2013.01)

(58) Field of Classification Search
None
See application file for complete search history.

(56) References Cited

U.S. PATENT DOCUMENTS

| 10,224,173 | B2 * | 3/2019 | Naruse | H01J 37/141 |
| 2006/0284093 | A1 * | 12/2006 | Kamiya | H01J 37/244 250/311 |
| 2011/0139986 | A1 | 6/2011 | Ohta | |
| 2018/0130633 | A1 | 5/2018 | Naruse et al. | |
| 2018/0358199 | A1 * | 12/2018 | Kumamoto | H01J 37/28 |

FOREIGN PATENT DOCUMENTS

JP          2018049728 A        3/2018

OTHER PUBLICATIONS

Partial European Search Report issued in EP20165301.1 dated Aug. 14, 2020.

* cited by examiner

*Primary Examiner* — James Choi
(74) *Attorney, Agent, or Firm* — The Webb Law Firm

(57) ABSTRACT

A method of controlling a transmission electron microscope includes: causing a first magnetic field lens to generate a first magnetic field and causing a second magnetic field lens to generate a second magnetic field; causing the magnetic field applying unit to generate a magnetic field of a direction along an optical axis on a specimen mounting surface; and changing excitations of the first excitation coil and the second excitation coil to correct a deviation of a focal length of an objective lens due to the magnetic field generated by the magnetic field applying unit.

7 Claims, 15 Drawing Sheets

METHOD OF CONTROLLING TRANSMISSION ELECTRON MICROSCOPE AND TRANSMISSION ELECTRON MICROSCOPE

CROSS-REFERENCE TO RELATED APPLICATION

This application claims priority to Japanese Patent Application No. 2019-063461, filed Mar. 28, 2019, the disclosure of which is hereby incorporated by reference in its entirety.

BACKGROUND OF THE INVENTION

Field of the Invention

The present invention relates to a method of controlling a transmission electron microscope and to a transmission electron microscope.

Description of Related Art

Magnetic field objective lenses are known as objective lenses of transmission electron microscopes. Improvements have been made to magnetic field objective lenses so that a focal length of the lenses is reduced by generating a ferromagnetic field on a specimen or in a vicinity of the specimen.

However, when observing a specimen that is sensitive to a magnetic field such as a magnetic specimen with a transmission electron microscope, there is a problem that a magnetic field generated by an objective lens causes a magnetic property of the specimen to change. When the magnetic field of the objective lens is provided at a position that is separated from the specimen in order to prevent the specimen from being affected by the magnetic field, a focal length of the objective lens increases and causes a resolution of the electron microscope to decline. Therefore, it is difficult to appropriately observe a magnetic specimen at a high resolution using a magnetic field objective lens.

In consideration of such problems, JP-A-2018-49728 discloses an objective lens that includes a first magnetic field lens and a second magnetic field lens which are arranged along an optical axis so as to sandwich a specimen mounting surface, the first magnetic field lens and the second magnetic field lens being provided so that a component along the optical axis of a magnetic field generated by the first magnetic field lens and a component along the optical axis of a magnetic field generated by the second magnetic field lens cancel each other out on the specimen mounting surface.

The objective lens disclosed in JP-A-2018-49728 includes a magnetic field applying unit for applying an arbitrary magnetic field to a specimen. Accordingly, for example, when the specimen is a magnetic material, a process by which a magnetic property is changed by a magnetic field and the like can be observed.

However, with the objective lens disclosed in JP-A-2018-49728, there are cases where a focal length of the objective lens changes due to leakage of the magnetic field generated by the magnetic field applying unit into the objective lens.

SUMMARY OF THE INVENTION

According to a first aspect of the invention, there is provided a method of controlling a transmission electron microscope that includes an objective lens, the objective lens including:
a first magnetic field lens and a second magnetic field lens which are arranged along an optical axis so as to sandwich a specimen mounting surface on which a specimen is to be mounted; and
a magnetic field applying unit which generates a magnetic field of a direction along the optical axis on the specimen mounting surface,
the first magnetic field lens having a first inner magnetic pole, a first outer magnetic pole, and a first excitation coil,
the second magnetic field lens having a second inner magnetic pole, a second outer magnetic pole, and a second excitation coil,
a distance between a tip section of the first outer magnetic pole and the specimen mounting surface being shorter than a distance between a tip section of the first inner magnetic pole and the specimen mounting surface,
a distance between a tip section of the second outer magnetic pole and the specimen mounting surface being shorter than a distance between a tip section of the second inner magnetic pole and the specimen mounting surface,
the first magnetic field lens generating a first magnetic field by exciting the first excitation coil to cause a magnetic flux to leak from a gap between the first inner magnetic pole and the first outer magnetic pole,
the second magnetic field lens generating a second magnetic field by exciting the second excitation coil to cause a magnetic flux to leak from a gap between the second inner magnetic pole and the second outer magnetic pole, and
a direction of a component of the first magnetic field along the optical axis and a direction of a component of the second magnetic field along the optical axis being opposite to each other, and
the method of controlling a transmission electron microscope including:
causing the first magnetic field lens to generate the first magnetic field and causing the second magnetic field lens to generate the second magnetic field;
causing the magnetic field applying unit to generate a magnetic field of a direction along the optical axis on the specimen mounting surface; and
changing excitations of the first excitation coil and the second excitation coil to correct a deviation of a focal length of the objective lens, the deviation being caused by the magnetic field generated by the magnetic field applying unit.

According to a second aspect of the invention, there is provided a transmission electron microscope including:
an objective lens; and
a control unit that controls the objective lens,
the objective lens including:
a first magnetic field lens and a second magnetic field lens which are arranged along an optical axis so as to sandwich a specimen mounting surface on which a specimen is to be mounted; and
a magnetic field applying unit which generates a magnetic field of a direction along the optical axis on the specimen mounting surface,
the first magnetic field lens having a first inner magnetic pole, a first outer magnetic pole, and a first excitation coil,
the second magnetic field lens having a second inner magnetic pole, a second outer magnetic pole, and a second excitation coil,
a distance between a tip section of the first outer magnetic pole and the specimen mounting surface being shorter than a distance between a tip section of the first inner magnetic pole and the specimen mounting surface, a distance between a tip section of the second outer magnetic pole and the specimen mounting surface being shorter than a distance between a tip section of the second inner magnetic pole and the specimen mounting surface, the first magnetic field lens generating a first magnetic field by exciting the first excitation coil to cause a magnetic flux to leak from a gap between the first inner magnetic pole and the first outer magnetic pole, the second magnetic field lens generating a second magnetic field by exciting the second excitation coil to cause a magnetic flux to leak from a gap between the second inner magnetic pole and the second outer magnetic pole, and a direction of a component of the first magnetic field along the optical axis and a direction of a component of the second magnetic field along the optical axis being opposite to each other, and the control unit performing:

processing of causing the first magnetic field lens to generate the first magnetic field and causing the second magnetic field lens to generate the second magnetic field;

processing of causing the magnetic field applying unit to generate a magnetic field of a direction along the optical axis on the specimen mounting surface; and processing of changing excitations of the first excitation coil and the second excitation coil to correct a deviation of a focal length of the objective lens, the deviation being caused by the magnetic field generated by the magnetic field applying unit.

Figure 1:
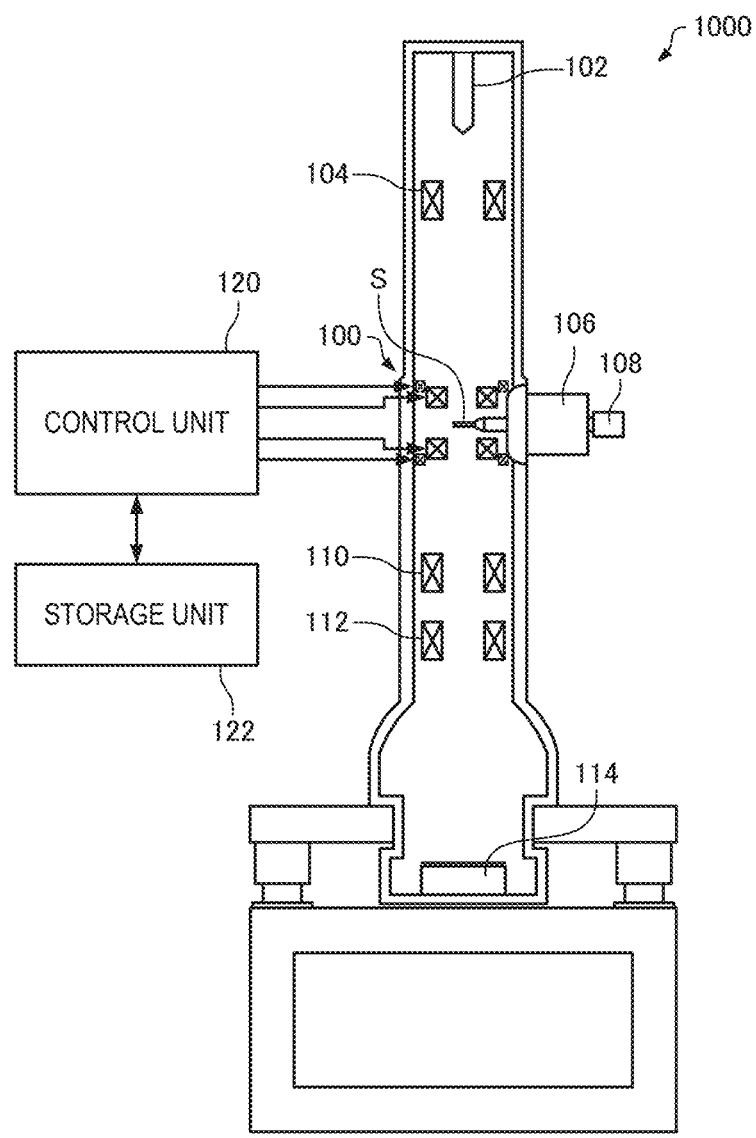
FIG. 1 is a diagram illustrating a configuration of a transmission electron microscope according to a first embodiment.

DESCRIPTION OF THE INVENTION (1) According to an embodiment of the invention, there is provided a method of controlling a transmission electron microscope including an objective lens, the objective lens including:

a first magnetic field lens and a second magnetic field lens which are arranged along an optical axis so as to sandwich a specimen mounting surface on which a specimen is to be mounted; and a magnetic field applying unit which generates a magnetic field of a direction along the optical axis on the specimen mounting surface, the first magnetic field lens having a first inner magnetic pole, a first outer magnetic pole, and a first excitation coil, the second magnetic field lens having a second inner magnetic pole, a second outer magnetic pole, and a second excitation coil, a distance between a tip section of the first outer magnetic pole and the specimen mounting surface being shorter than a distance between a tip section of the first inner magnetic pole and the specimen mounting surface, a distance between a tip section of the second outer magnetic pole and the specimen mounting surface being shorter than a distance between a tip section of the second inner magnetic pole and the specimen mounting surface, the first magnetic field lens generating a first magnetic field by exciting the first excitation coil to cause a magnetic flux to leak from a gap between the first inner magnetic pole and the first outer magnetic pole, the second magnetic field lens generating a second magnetic field by exciting the second excitation coil to cause a magnetic flux to leak from a gap between the second inner magnetic pole and the second outer magnetic pole, a direction of a component of the first magnetic field along the optical axis and a direction of a component of the second magnetic field along the optical axis being opposite to each other, and the method of controlling a transmission electron microscope including:

causing the first magnetic field lens to generate the first magnetic field and causing the second magnetic field lens to generate the second magnetic field;

causing the magnetic field applying unit to generate a magnetic field of a direction along the optical axis on the specimen mounting surface; and changing excitations of the first excitation coil and the second excitation coil to correct a deviation of a focal length of the objective lens, the deviation being caused by the magnetic field generated by the magnetic field applying unit.

With the method of controlling a transmission electron microscope described above, a deviation of the focal length of the objective lens caused by the magnetic field generated by the magnetic field applying unit can be corrected. Therefore, a good transmission electron microscope image can be obtained in a state where an arbitrary magnetic field is applied to the specimen.

(2) According to an embodiment of the invention, there is provided a transmission electron microscope including:

an objective lens; and a control unit that controls the objective lens, the objective lens including:

a first magnetic field lens and a second magnetic field lens which are arranged along an optical axis so as to sandwich a specimen mounting surface on which a specimen is to be mounted; and a magnetic field applying unit which generates a magnetic field of a direction along the optical axis on the specimen mounting surface, the first magnetic field lens having a first inner magnetic pole, a first outer magnetic pole, and a first excitation coil, the second magnetic field lens having a second inner magnetic pole, a second outer magnetic pole, and a second excitation coil, a distance between a tip section of the first outer magnetic pole and the specimen mounting surface being shorter than a distance between a tip section of the first inner magnetic pole and the specimen mounting surface, a distance between a tip section of the second outer magnetic pole and the specimen mounting surface being shorter than a distance between a tip section of the second inner magnetic pole and the specimen mounting surface, the first magnetic field lens generating a first magnetic field by exciting the first excitation coil to cause a magnetic flux to leak from a gap between the first inner magnetic pole and the first outer magnetic pole, the second magnetic field lens generating a second magnetic field by exciting the second excitation coil to cause a magnetic flux to leak from a gap between the second inner magnetic pole and the second outer magnetic pole, a direction of a component of the first magnetic field along the optical axis and a direction of a component of the second magnetic field along the optical axis being opposite to each other, and the control unit performing:

processing of causing the first magnetic field lens to generate the first magnetic field and causing the second magnetic field lens to generate the second magnetic field;

processing of causing the magnetic field applying unit to generate a magnetic field of a direction along the optical axis on the specimen mounting surface; and processing of changing excitations of the first excitation coil and the second excitation coil to correct a deviation of a focal length of the objective lens, the deviation being caused by the magnetic field generated by the magnetic field applying unit.

With the transmission electron microscope described above, a deviation of the focal length of the objective lens caused by the magnetic field generated by the magnetic field applying unit can be corrected. Therefore, a good transmission electron microscope image can be obtained in a state where an arbitrary magnetic field is applied to the specimen.

Embodiments of the invention are described in detail below with reference to the drawings. Note that the following embodiments do not unduly limit the scope of the invention as stated in the claims. In addition, all of the elements described below are not necessarily essential requirements of the invention.

1. First Embodiment 1.1 Configuration of Transmission Electron Microscope

First, a configuration of a transmission electron microscope according to a first embodiment will be described with reference to the drawings. FIG. 1 is a diagram illustrating a configuration of a transmission electron microscope 1000 according to the first embodiment.

The transmission electron microscope 1000 includes an objective lens 100. It should be noted that FIG. 1 illustrates the objective lens 100 and a specimen stage 106 in a simplified manner for the sake of brevity.

As illustrated in FIG. 1, the transmission electron microscope 1000 includes an electron source 102, an illumination lens 104, the objective lens 100, the specimen stage 106, a specimen holder 108, an intermediate lens 110, a projector lens 112, an imaging device 114, a control unit 120, and a storage unit 122.

The electron source 102 generates electrons. The electron source 102 is, for example, an electron gun which accelerates electrons emitted from a cathode by an anode and which emits an electron beam.

The illumination lens 104 causes the electron beam discharged from the electron source 102 to converge and illuminates a specimen S with the converged electron beam. Although not illustrated, the illumination lens 104 may be constituted by a plurality of electron lenses.

The specimen stage 106 holds the specimen S. In the illustrated example, the specimen stage 106 holds the specimen S via the specimen holder 108. The specimen S can be positioned using the specimen stage 106. For example, the specimen stage 106 is a goniometer stage that is capable of tilting the specimen S.

The objective lens 100 is a first-stage lens for forming a transmission electron microscope image with an electron beam transmitted through the specimen S. Details of the objective lens 100 will be described in "1.2. Configuration of Objective Lens" provided later.

The intermediate lens 110 and the projector lens 112 enlarge the image formed by the objective lens 100 and produce an image on the imaging device 114. The objective lens 100, the intermediate lens 110, and the projector lens 112 constitute an imaging system of the transmission electron microscope 1000.

The imaging device 114 photographs a transmission electron microscope image formed by the imaging system. For example, the imaging device 114 is a digital camera such as a charge coupled device (CCD) camera or a complementary metal-oxide-semiconductor (CMOS) camera.

The control unit 120 controls the objective lens 100. A method of controlling the objective lens 100 will be described later. Functions of the control unit 120 can be realized by having various processors (a central processing unit (CPU) and the like) execute programs. It should be noted that at least a part of the functions of the control unit 120 may be realized by a dedicated circuit such as an ASIC (a gate array or the like).

The storage unit 122 stores programs and data which cause or allow the control unit 120 to perform various types of calculation processing and control processing. In addition, the storage unit 122 is also used as a work area of the control unit 120. The storage unit 122 can be realized by, for example, a random access memory (RAM), a read only memory (ROM), and a hard disk.

1.2. Configuration of Objective Lens

Figure 2:
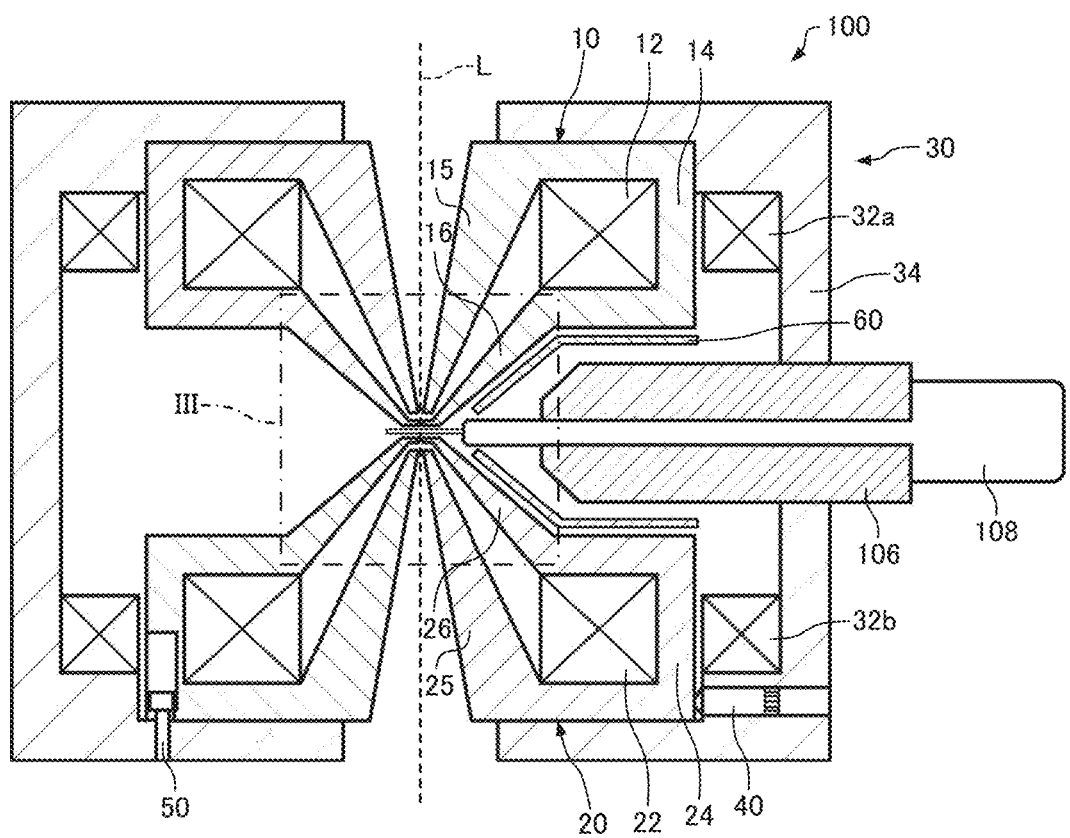
FIG. 2 is a sectional view schematically illustrating an objective lens.
Figure 3:
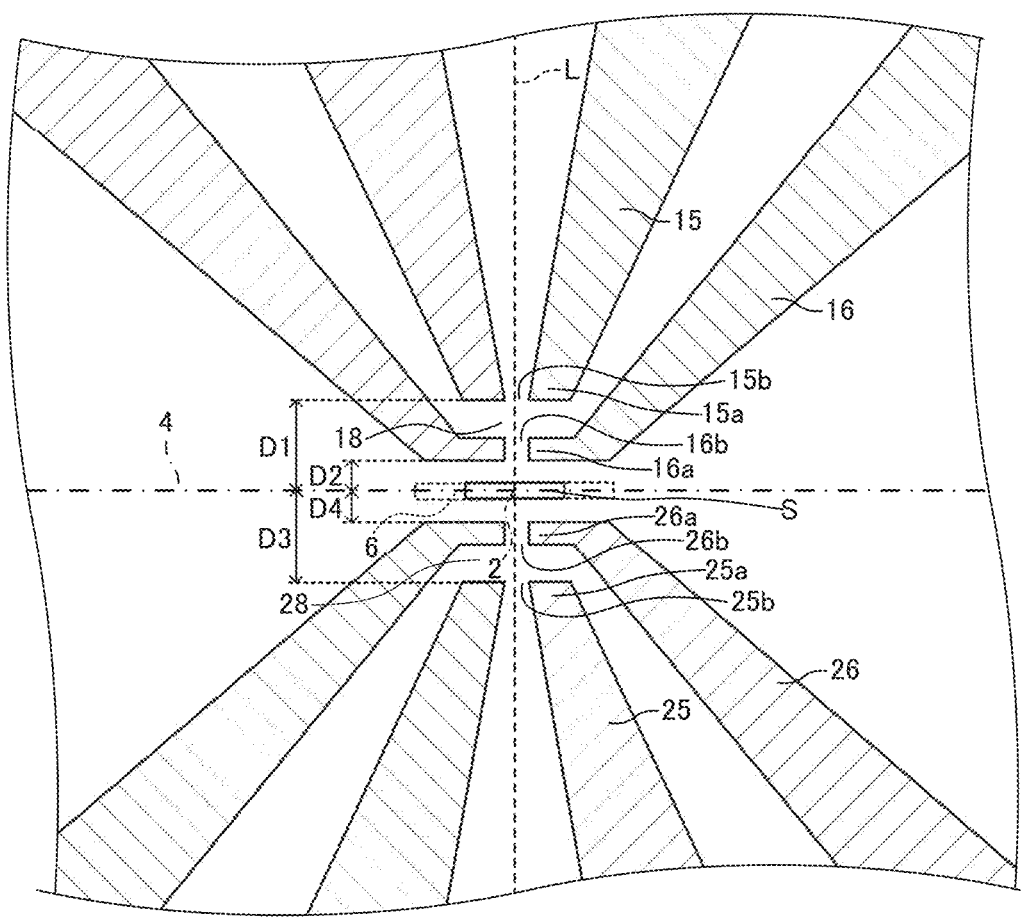
FIG. 3 is a sectional view schematically illustrating the objective lens.

Next, a configuration of the objective lens 100 will be described with reference to the drawings. FIG. 2 is a sectional view schematically illustrating the objective lens 100. It should be noted that FIG. 2 illustrates a state where the specimen holder 108 is inserted into the specimen stage 106. FIG. 3 is a sectional view which schematically illustrates the objective lens 100 and which is an enlarged view of a region III in FIG. 2.

As illustrated in FIG. 2, the objective lens 100 includes a first magnetic field lens 10, a second magnetic field lens 20, a magnetic field applying unit 30, a position adjusting unit 40, a fixing unit 50, and an anti-magnetic tube 60. It should be noted that FIG. 3 only illustrates the first magnetic field lens 10 and the second magnetic field lens 20 for the sake of brevity.

The first magnetic field lens 10 and the second magnetic field lens 20 are arranged along an optical axis L of the objective lens 100. The first magnetic field lens 10 is positioned above (on a side of the illumination lens 104 of) a specimen mounting surface 2, and the second magnetic field lens 20 is positioned below (on a side of the intermediate lens 110 of) the specimen mounting surface 2. The first magnetic field lens 10 and the second magnetic field lens 20 are arranged so as to sandwich the specimen mounting surface 2.

In the objective lens 100, the specimen S is arranged on the specimen mounting surface 2 between the first magnetic field lens 10 and the second magnetic field lens 20. The specimen mounting surface 2 is a surface perpendicular to the optical axis L. The specimen mounting surface 2 is a surface on which the specimen S is arranged in the objective lens 100. For example, the specimen mounting surface 2 is a surface which is centered on a specimen origin position (in other words, a position where the optical axis L and the specimen mounting surface 2 intersect) and which has a sufficient size to arrange the specimen S. The specimen stage 106 is a specimen stage that adopts a side entry system to which the specimen holder 108 is inserted from a direction (a horizontal direction) that is perpendicular to the optical axis L with respect to the first magnetic field lens 10 and the second magnetic field lens 20.

The first magnetic field lens 10 and the second magnetic field lens 20 are provided so that a component in a direction (a vertical direction) along the optical axis L of the magnetic field generated by the first magnetic field lens 10 and a component in the direction along the optical axis L of the magnetic field generated by the second magnetic field lens 20 cancel each other out on the specimen mounting surface 2.

The first magnetic field lens 10 has a first excitation coil 12 and a first yoke 14. The first excitation coil 12 is connected to a power supply (not illustrated). The first yoke 14 is provided so as to surround the first excitation coil 12. The first yoke 14 has an inner magnetic pole 15 (an example of the first inner magnetic pole) and an outer magnetic pole 16 (an example of the first outer magnetic pole).

The inner magnetic pole 15 and the outer magnetic pole 16 have a ring shape. The inner magnetic pole 15 is arranged on a side of the optical axis L, and the outer magnetic pole 16 is arranged on an outer side of the inner magnetic pole 15. The outer magnetic pole 16 is arranged on an outer side of the inner magnetic pole 15. The inner magnetic pole 15 extends toward the specimen mounting surface 2 from a portion that surrounds the first excitation coil 12. In a similar manner, the outer magnetic pole 16 extends toward the specimen mounting surface 2 from a portion that surrounds the first excitation coil 12.

A distance D2 between a tip section 16a of the outer magnetic pole 16 and the specimen mounting surface 2 is shorter than a distance D1 between a tip section 15a of the inner magnetic pole 15 and the specimen mounting surface 2. In other words, in the direction along the optical axis L, the tip section 16a of the outer magnetic pole 16 is positioned between the tip section 15a of the inner magnetic pole 15 and the specimen mounting surface 2.

The tip section 16a of the outer magnetic pole 16 cantilevers toward the optical axis L. In other words, the tip section 16a of the outer magnetic pole 16 is positioned on a side of the optical axis L as compared to other portions of the outer magnetic pole 16.

When viewed from the direction along the optical axis L, the tip section 16a of the outer magnetic pole 16 overlaps with a specimen movable region 6. In addition, when viewed from the direction along the optical axis L, the tip section 16a of the outer magnetic pole 16 overlaps with the tip section 15a of the inner magnetic pole 15. A distance between the tip section 15a of the inner magnetic pole 15 and the optical axis L is equal to a distance between the tip section 16a of the outer magnetic pole 16 and the optical axis L.

In this case, the specimen movable region 6 refers to a region where the specimen S supported by the specimen holder 108 is movable by an action of the specimen stage 106. For example, when a diameter of the specimen S is 3 mm, the specimen stage 106 is capable of moving the specimen S by around ±1.2 mm centered on the specimen origin position within a virtual plane 4 that includes the specimen mounting surface 2. In this case, a width of the specimen movable region 6 is ±2.7 mm centered on the specimen origin position.

A center of an opening 15b that is defined by the tip section 15a of the inner magnetic pole 15 is positioned above the optical axis L. In a similar manner, a center of an opening 16b that is defined by the tip section 16a of the outer magnetic pole 16 is positioned above the optical axis L. A shape of the opening 15b of the inner magnetic pole 15 and a shape of the opening 16b of the outer magnetic pole 16 are circles. A diameter of the opening 15b of the inner magnetic pole 15 and a diameter of the opening 16b of the outer magnetic pole 16 are equal to each other.

A gap (a void) 18 is provided between the tip section 15a of the inner magnetic pole 15 and the tip section 16a of the outer magnetic pole 16. The gap 18 has a ring shape that surrounds the optical axis L and, more specifically, a cylindrical surface shape with the optical axis L as a central axis. In the objective lens 100, since the tip section 16a of the outer magnetic pole 16 cantilevers toward the optical axis L, the gap 18 is not facing the direction of the specimen mounting surface 2. In the illustrated example, the gap 18 faces a direction perpendicular to the optical axis L.

The second magnetic field lens 20 has a second excitation coil 22 and a second yoke 24. The second excitation coil 22 is connected to a power supply (not illustrated). The second yoke 24 is provided so as to surround the second excitation coil 22. The second yoke 24 has an inner magnetic pole 25 (an example of the second inner magnetic pole) and an outer magnetic pole 26 (an example of the second outer magnetic pole).

The inner magnetic pole 25 and the outer magnetic pole 26 have a ring shape. The inner magnetic pole 25 is arranged on a side of the optical axis L, and the outer magnetic pole 26 is arranged on an outer side of the inner magnetic pole 25. The inner magnetic pole 25 extends toward the specimen mounting surface 2 from a portion that surrounds the second excitation coil 22. In a similar manner, the outer magnetic pole 26 extends toward the specimen mounting surface 2 from a portion that surrounds the second excitation coil 22.

A distance D4 between a tip section 26a of the outer magnetic pole 26 and the specimen mounting surface 2 is shorter than a distance D3 between a tip section 25a of the inner magnetic pole 25 and the specimen mounting surface 2. In other words, in the direction along the optical axis L, the tip section 26a of the outer magnetic pole 26 is positioned between the tip section 25a of the inner magnetic pole 25 and the specimen mounting surface 2.

The tip section 26a of the outer magnetic pole 26 cantilevers toward the optical axis L. In other words, the tip section 26a of the outer magnetic pole 26 is positioned on a side of the optical axis L as compared to other portions of the outer magnetic pole 26.

When viewed from the direction along the optical axis L, the tip section 26a of the outer magnetic pole 26 overlaps with the specimen movable region 6. In addition, when viewed from the direction along the optical axis L, the tip section 26a of the outer magnetic pole 26 overlaps with the tip section 25a of the inner magnetic pole 25. A distance between the tip section 25a of the inner magnetic pole 25 and the optical axis L is equal to a distance between the tip section 26a of the outer magnetic pole 26 and the optical axis L.

A center of an opening 25b that is defined by the tip section 25a of the inner magnetic pole 25 is positioned above the optical axis L. In a similar manner, a center of an opening 26b that is defined by the tip section 26a of the outer magnetic pole 26 is positioned above the optical axis L. A shape of the opening 25b of the inner magnetic pole 25 and a shape of the opening 26b of the outer magnetic pole 26 are circles. A diameter of the opening 25b of the inner magnetic pole 25 and a diameter of the opening 26b of the outer magnetic pole 26 are equal to each other.

A gap (a void) 28 is provided between the tip section 25a of the inner magnetic pole 25 and the tip section 26a of the outer magnetic pole 26. The gap 28 has a ring shape that surrounds the optical axis L and, more specifically, a cylindrical surface shape with the optical axis L as a central axis. In the objective lens 100, since the tip section 16a of the outer magnetic pole 16 cantilevers toward the optical axis L, the gap 28 is not facing the direction of the specimen mounting surface 2. In the illustrated example, the gap 28 faces a direction perpendicular to the optical axis L.

A configuration of the first magnetic field lens 10 and a configuration of the second magnetic field lens 20 are, for example, the same. In addition, the first magnetic field lens 10 and the second magnetic field lens 20 are symmetrically arranged with respect to the virtual plane 4 that includes the specimen mounting surface 2.

The magnetic field applying unit 30 has a first magnetic field applying coil 32a, a second magnetic field applying coil 32b, and a magnetic field applying coil yoke 34.

The first magnetic field applying coil 32a is arranged on an outer side of the first excitation coil 12. For example, the first magnetic field applying coil 32a and the first excitation coil 12 are concentrically arranged. The second magnetic field applying coil 32b is arranged on an outer side of the second excitation coil 22. For example, the second magnetic field applying coil 32b and the second excitation coil 22 are concentrically arranged.

The magnetic field applying coil yoke 34 is provided so as to surround the first magnetic field applying coil 32a and the second magnetic field applying coil 32b. The magnetic field applying coil yoke 34 has a columnar shape including an upper surface and a lower surface, and the upper surface and the lower surface are respectively provided with a circular opening that is centered on the optical axis L. The second magnetic field lens 20 is placed on an inner bottom surface of the magnetic field applying coil yoke 34. In addition, the first magnetic field lens 10 is fixed to an inner upper surface of the magnetic field applying coil yoke 34.

The position adjusting unit 40 is for adjusting a position of the second magnetic field lens 20 that is placed on the magnetic field applying coil yoke 34. For example, the position adjusting unit 40 is a position adjusting screw for pushing the second magnetic field lens 20 in a direction (a horizontal direction) that is perpendicular to the optical axis L. Although not illustrated, the screw is provided in plurality and the screws are capable of pushing the second magnetic field lens 20 from mutually different directions. Using the position adjusting unit 40, the position of the second magnetic field lens 20 with respect to the first magnetic field lens 10 can be adjusted. Accordingly, the first magnetic field lens 10 and the second magnetic field lens 20 can be readily symmetrically arranged with respect to the virtual plane 4. In addition, by using the position adjusting unit 40, the second magnetic field lens 20 can be positioned in a state where an electron beam is being irradiated.

The fixing unit 50 is for fixing the second magnetic field lens 20 of which the position has been adjusted to the magnetic field applying coil yoke 34. The fixing unit 50 is, for example, a bolt, and by screwing the bolt into a female screw provided in the magnetic field applying coil yoke 34, the second magnetic field lens 20 can be fixed to the magnetic field applying coil yoke 34.

While the first magnetic field lens 10 is fixed and the position of the second magnetic field lens 20 is adjustable in the illustrated example, alternatively, the position of the first magnetic field lens 10 may be adjustable and the second magnetic field lens 20 may be fixed. In this case, the fixing unit 50 may fix the first magnetic field lens 10 to the magnetic field applying coil yoke 34. In addition, positions of both the first magnetic field lens 10 and the second magnetic field lens 20 may be made adjustable. In this case, the fixing unit 50 may fix both the first magnetic field lens 10 and the second magnetic field lens 20 to the magnetic field applying coil yoke 34.

The anti-magnetic tube 60 is arranged between the first magnetic field lens 10 and the second magnetic field lens 20. The anti-magnetic tube 60 is provided so as to surround a path for loading the specimen S into the objective lens 100 from outside. It should be noted that, in the objective lens 100, the path for loading the specimen S and a path for extracting the specimen S from inside the objective lens 100 are the same.

The anti-magnetic tube 60 is arranged between the first magnetic field lens 10 and the specimen stage 106 and between the second magnetic field lens 20 and the specimen stage 106. The anti-magnetic tube 60 is a cylindrical member and has a portion of which a diameter becomes smaller the closer the portion is to the specimen mounting surface 2. The anti-magnetic tube 60 is constructed of a material with high magnetic permeability. The material of the anti-magnetic tube 60 is, for example, Permalloy.

Since the anti-magnetic tube 60 is provided on the path for loading the specimen S, for example, when the specimen S is sensitive to a magnetic field such as a magnetic specimen, loading of the specimen S and extraction of the specimen S in a state where the objective lens 100 is excited does not have a large impact on a magnetic property of the specimen S.

Figure 4:
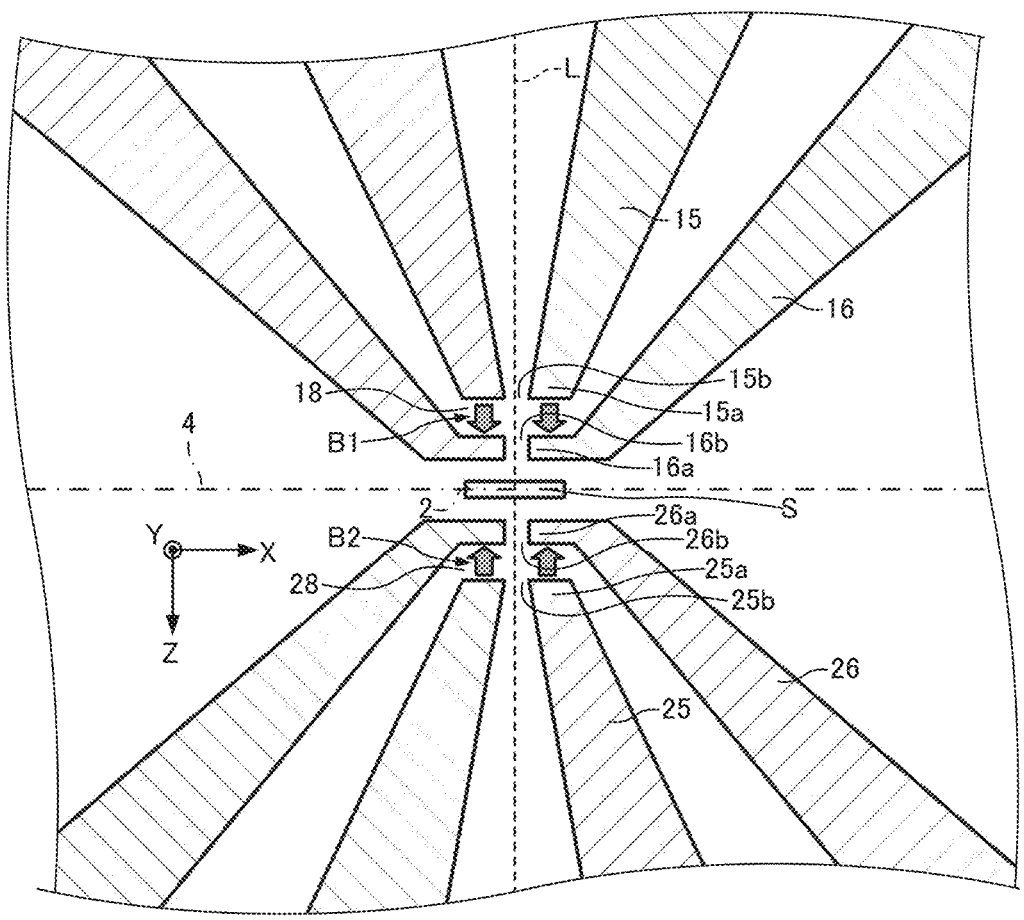
FIG. 4 is a diagram for illustrating magnetic fields generated by a first magnetic field lens and a second magnetic field lens.

1.3. Operations of Objective Lens (1) Operations of First Magnetic Field Lens and Second Magnetic Field Lens FIG. 4 is a diagram for illustrating magnetic fields generated by the first magnetic field lens 10 and the second magnetic field lens 20. It should be noted that an X axis, a Y axis, and a Z axis are illustrated in FIG. 4 as three mutually perpendicular axes. The Z axis is an axis along the optical axis L (an axis that is parallel to the optical axis L), and the X axis and the Y axis are axes that are perpendicular to the optical axis L. In the illustrated example, a Z direction is a vertical direction and the X direction and the Y direction are horizontal directions.

Figure 5:
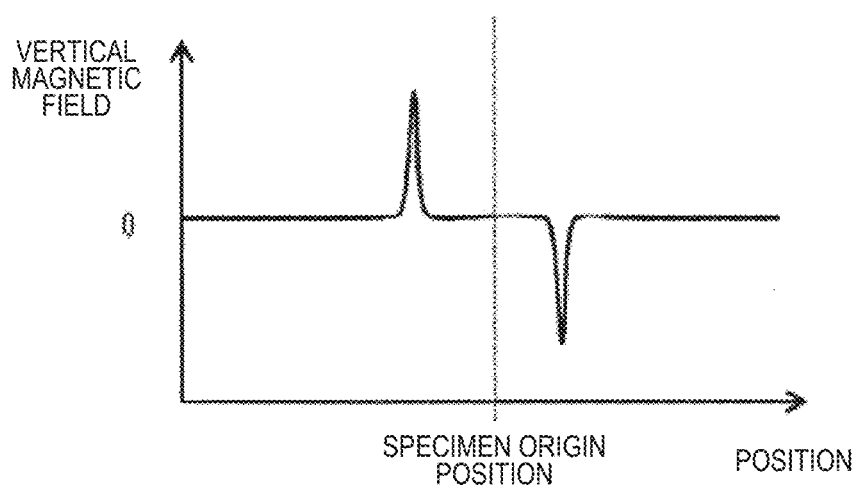
FIG. 5 is a diagram illustrating a distribution of vertical magnetic fields that are generated by the first magnetic field lens and the second magnetic field lens.

FIG. 5 is a diagram illustrating a distribution of vertical magnetic fields that are generated by the first magnetic field lens 10 and the second magnetic field lens 20. An abscissa of a graph illustrated in FIG. 5 represents a position on the optical axis L and an ordinate represents a magnitude of a vertical magnetic field (a component in a direction along the optical axis L of the magnetic field, a Z component of the magnetic field).

When an excitation current is supplied to the first excitation coil 12 of the first magnetic field lens 10 from a power supply, the first magnetic field lens 10 generates a first magnetic field B1 to the front (on a side of the illumination lens, on a side of a −Z direction) of the specimen S. Specifically, when an excitation current is supplied to the first excitation coil 12, the first excitation coil 12 is excited and a magnetic flux (a magnetic path) is created inside the first yoke 14. The magnetic flux leaks from the gap 18 between the tip section 15a of the inner magnetic pole 15 and the tip section 16a of the outer magnetic pole 16 and the first magnetic field B1 which is rotationally symmetric around the optical axis L is generated. Since the tip section 16a of the outer magnetic pole 16 of the first magnetic field lens 10 cantilevers toward the optical axis L, the gap 18 is not facing the direction of the specimen S (the direction of the specimen mounting surface 2, the Z direction). Therefore, components (X and Y components) in directions perpendicular to the optical axis L of the first magnetic field B1 are small not only at the specimen origin position of the specimen S but also over a wide range in the vicinity of the specimen S.

In a similar manner, when an excitation current is supplied to the second excitation coil 22 of the second magnetic field lens 20 from the power supply, the second magnetic field lens 20 generates a second magnetic field B2 to the rear (on a side of the intermediate lens, on a side of a +Z direction) of the specimen S. Specifically, when an excitation current is supplied to the second excitation coil 22, a magnetic flux (a magnetic path) is created inside the second yoke 24. The magnetic flux leaks from the gap 28 between the tip section 25a of the inner magnetic pole 25 and the tip section 26a of the outer magnetic pole 26 and the second magnetic field B2 which is rotationally symmetric around the optical axis L is generated. Since the tip section 26a of the outer magnetic pole 26 of the second magnetic field lens 20 cantilevers toward the optical axis L, the gap 28 is not facing the direction of the specimen S (the direction of the specimen mounting surface 2, the Z direction). Therefore, components (X and Y components) in directions perpendicular to the optical axis L of the second magnetic field B2 are small not only at the specimen origin position of the specimen S but also over a wide range in the vicinity of the specimen S.

In this manner, since the tip section 16a of the outer magnetic pole 16 of the first magnetic field lens 10 cantilevers toward the optical axis L, a component in a direction that is perpendicular to the optical axis L of the first magnetic field B1 is prevented from reaching the vicinity of the specimen S. In a similar manner, since the tip section 26a of the outer magnetic pole 26 of the second magnetic field lens 20 cantilevers toward the optical axis L, a component in a direction that is perpendicular to the optical axis L of the second magnetic field B2 is prevented from reaching the vicinity of the specimen S.

The direction of the component (a Z component) along the optical axis L of the first magnetic field B1 generated by the first magnetic field lens 10 and the direction of the component along the optical axis L of the second magnetic field B2 generated by the second magnetic field lens 20 are opposite to each other. Therefore, the component in a direction along the optical axis L of the first magnetic field B1 and the component in the direction along the optical axis L of the second magnetic field B2 can be caused to act so as to cancel each other out. Accordingly, as illustrated in FIG. 5, a magnetic field of a direction along the optical axis L on the specimen mounting surface 2 can be made extremely small.

(2) Operations of Magnetic Field Applying Unit

Figure 6:
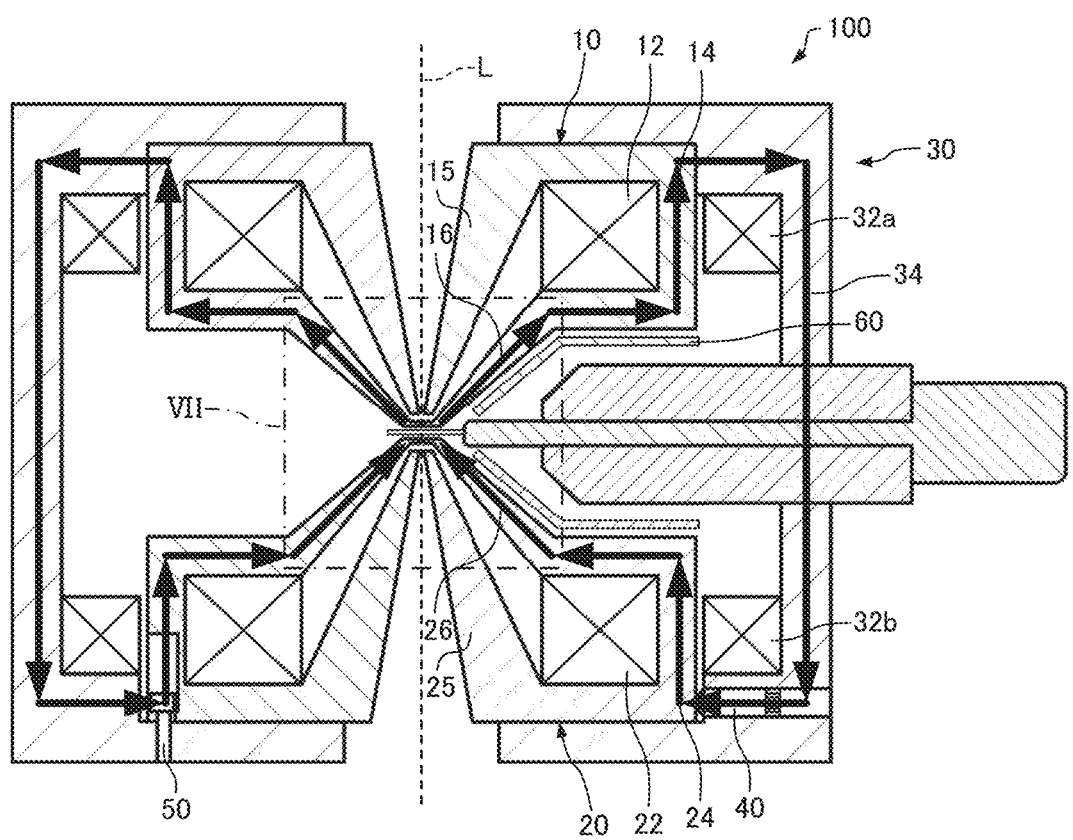
FIG. 6 is a diagram for illustrating operations of a magnetic field applying unit.
Figure 7:
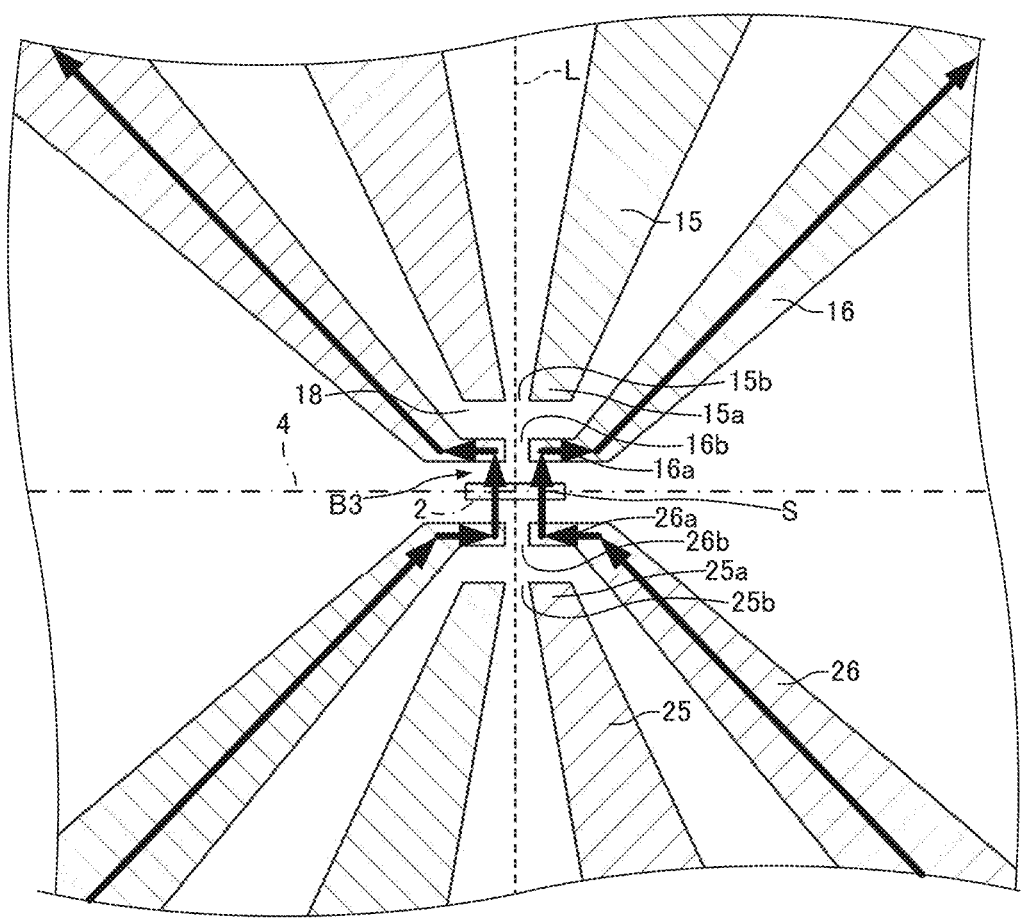
FIG. 7 is a diagram for illustrating operations of the magnetic field applying unit.

FIG. 6 is a diagram for illustrating operations of the magnetic field applying unit 30. FIG. 7 is a diagram which illustrates operations of the magnetic field applying unit 30 and which is an enlarged view of a region VII in FIG. 6. Arrows illustrated in FIGS. 6 and 7 represent a path (a magnetic path) of a magnetic flux generated by the magnetic field applying unit 30.

As illustrated in FIGS. 6 and 7, in the objective lens 100, a path (a magnetic path) of a magnetic flux that passes the tip section 26a of the outer magnetic pole 26 of the second magnetic field lens 20, a space between the tip section 26a of the outer magnetic pole 26 and the tip section 16a of the outer magnetic pole 16, and the tip section 16a of the outer magnetic pole 16 of the first magnetic field lens 10 can be formed by the magnetic field applying unit 30. The space between the tip section 26a of the outer magnetic pole 26 and the tip section 16a of the outer magnetic pole 16 includes the specimen mounting surface 2.

As a result, in the objective lens 100, a magnetic field B3 (a magnetic field in the Z direction) in a direction along the optical axis L can be generated in the space between the tip section 26a of the outer magnetic pole 26 and the tip section 16a of the outer magnetic pole 16. Therefore, in the objective lens 100, the magnetic field B3 in a direction along the optical axis L can be applied to the specimen S when observing the specimen S. Accordingly, for example, when the specimen S is a magnetic material, a process by which a magnetic property is changed by the magnetic field B3 and the like can be observed.

1.4. Control Method of Transmission Electron Microscope

Next, a method of controlling the transmission electron microscope 1000 will be described. Hereinafter, a case of acquiring a transmission electron microscope image of the specimen S in a state where the magnetic field B3 is applied to the specimen S by the magnetic field applying unit 30 will be described.

The method of controlling the transmission electron microscope 1000 includes: a step of causing the first magnetic field lens 10 to generate the first magnetic field B1 and causing the second magnetic field lens 20 to generate the second magnetic field B2; a step of generating a magnetic field of a direction along the optical axis L on the specimen mounting surface 2 using the magnetic field applying unit 30; and a step of correcting a deviation of a focal length of the objective lens 100 due to the magnetic field generated by the magnetic field applying unit 30 by changing excitations of the first excitation coil 12 and the second excitation coil 22.

(1) Step of Generating First Magnetic Field B1 and Second Magnetic Field B2

First, the first magnetic field lens 10 is caused to generate the first magnetic field B1 and the second magnetic field lens 20 is caused to generate the second magnetic field B2.

Specifically, a current is supplied to the first excitation coil 12 and the second excitation coil 22. A current amount to be supplied to the first excitation coil 12 and the second excitation coil 22 is determined by optical conditions (for example, a focal length) of the objective lens 100.

By causing the first magnetic field lens 10 to generate the first magnetic field B1 and causing the second magnetic field lens 20 to generate the second magnetic field B2, the objective lens 100 forms a transmission electron microscope image. As a result, the transmission electron microscope 1000 enters a state where the specimen S can be observed.

(2) Step of Generating Magnetic Field B3

Next, using the magnetic field applying unit 30, the magnetic field B3 in a direction along the optical axis L is generated on the specimen mounting surface 2. Specifically, the magnetic field B3 is generated on the specimen mounting surface 2 by supplying a current to the first magnetic field applying coil 32a and the second magnetic field applying coil 32b. A current amount to be supplied to the first magnetic field applying coil 32a and the second magnetic field applying coil 32b is determined by a size of the magnetic field B3. In addition, a direction of the current to be supplied to the first magnetic field applying coil 32a and the second magnetic field applying coil 32b is determined by a direction of the magnetic field B3. In the transmission electron microscope 1000, an arbitrary magnetic field can be applied to the specimen S.

(3) Step of Correcting Deviation of Focal Length of Objective Lens

Figure 8:
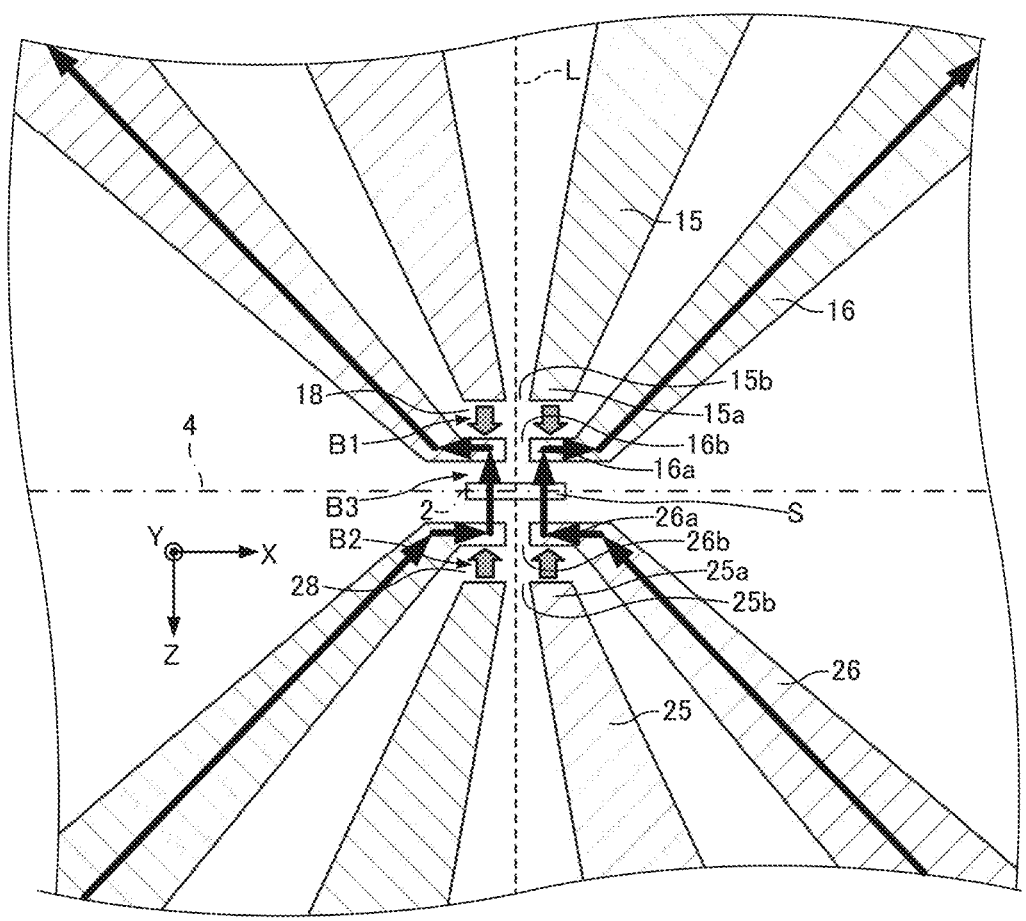
FIG. 8 is a diagram schematically illustrating how a magnetic field is applied to a specimen.

FIG. 8 is a diagram schematically illustrating how the magnetic field B3 is being applied to the specimen S by the magnetic field applying unit 30. In FIG. 8, the direction of the magnetic field B3 is a −Z direction.

The magnetic field B3 generated by the magnetic field applying unit 30 leaks to the first magnetic field lens 10 and the second magnetic field lens 20. In the example illustrated in FIG. 8, the magnetic field B3 is in the −Z direction and the first magnetic field B1 is in the +Z direction. In other words, the direction of the magnetic field B3 and the direction of the first magnetic field B1 are opposite directions. Therefore, the first magnetic field B1 is weakened by the leakage of the magnetic field B3. In addition, the second magnetic field B2 is in the −Z direction. In other words, the direction of the magnetic field B3 and the direction of the second magnetic field B2 are the same direction. Therefore, the second magnetic field B2 is strengthened by the leakage of the magnetic field B3.

A change in a magnetic field acting on an electron beam due to the leakage of the magnetic field B3 that is generated by the magnetic field applying unit 30 causes the focal length of the objective lens 100 to change. A change in the focal length of the objective lens 100 changes a magnification, a rotation of an image, conditions of aberration correction, and the like. Therefore, a good transmission electron microscope image cannot be obtained.

Thus, a deviation of the focal length of the objective lens 100 caused by the magnetic field B3 is corrected by changing excitations of the first excitation coil 12 and the second excitation coil 22. As a result, with the transmission electron microscope 1000, a good transmission electron microscope image can be obtained in a state where the magnetic field B3 is applied to the specimen S.

For example, when the magnetic field B3 and the first magnetic field B1 are in the same direction, excitation of the first excitation coil 12 is weakened and excitation of the second excitation coil 22 is strengthened. On the other hand, when the magnetic field B3 and the second magnetic field B2 are in the same direction, excitation of the first excitation coil 12 is strengthened and excitation of the second excitation coil 22 is weakened. In the example illustrated in FIG. 8, since the magnetic field B3 and the second magnetic field B2 are in the same direction, excitation of the first excitation coil 12 is strengthened and excitation of the second excitation coil 22 is weakened.

By correcting a deviation of the focal length of the objective lens 100 caused by the magnetic field B3, the focal length of the objective lens 100 can be brought close to the focal length prior to generating the magnetic field B3.

Figure 9:
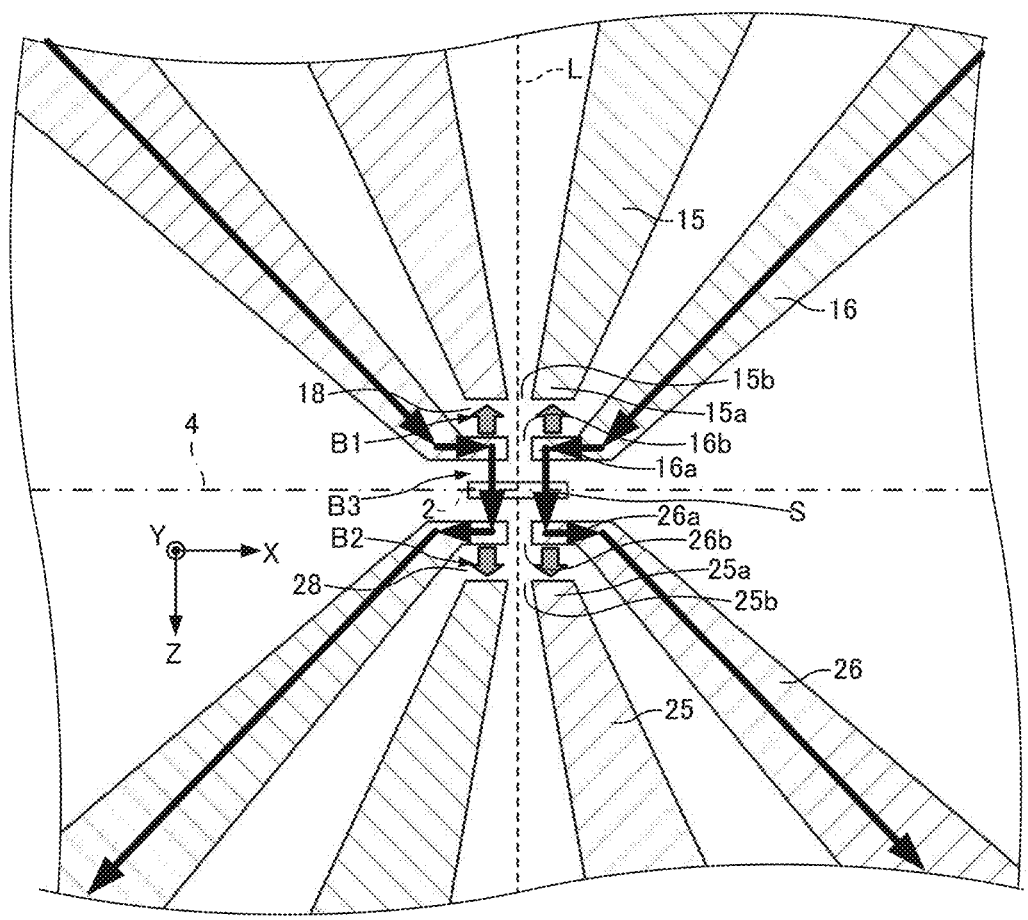
FIG. 9 is a diagram schematically illustrating how a magnetic field is applied to the specimen.

FIG. 9 is a diagram schematically illustrating how the magnetic field B3 is being applied to the specimen S by the magnetic field applying unit 30. In FIG. 9, the direction of the magnetic field B3 is a +Z direction.

In the example illustrated in FIG. 9, the magnetic field B3 is in the +Z direction and the first magnetic field B1 is in the −Z direction. In other words, the direction of the magnetic field B3 and the direction of the first magnetic field B1 are opposite directions. Therefore, the first magnetic field B1 is weakened by the leakage of the magnetic field B3. In addition, the second magnetic field B2 is in the +Z direction. In other words, the direction of the magnetic field B3 and the direction of the second magnetic field B2 are the same direction. Therefore, the second magnetic field B2 is strengthened by the leakage of the magnetic field B3. Thus, in the example illustrated in FIG. 9, excitation of the first excitation coil 12 is strengthened and excitation of the second excitation coil 22 is weakened.

The direction of the first magnetic field B1 and the direction of the second magnetic field B2 are changed between a case where the magnetic field B3 is in the +Z direction as illustrated in FIG. 8 and a case where the magnetic field B3 is in the −Z direction as illustrated in FIG. 9. Specifically, even when the direction of the magnetic field B3 is changed, the direction of the magnetic field B3 and the direction of the second magnetic field B2 are made the same. Accordingly, even when the leakage of the magnetic field B3 is large, the focal length of the second magnetic field lens 20 which is an important lens in terms of image formation can be more accurately corrected. A reason therefor will be described below.

In the transmission electron microscope 1000, the objective lens 100 is mainly used for image formation. In the objective lens 100, the lens that is important in terms of image formation is the second magnetic field lens 20 which creates the second magnetic field B2 that acts on an electron beam having been transmitted through the specimen S.

Although not illustrated, a case where the direction of the magnetic field B3 and the direction of the second magnetic field B2 are opposite directions will be considered. In this case, excitation of the second excitation coil 22 is strengthened. However, since there is a limit to an excitation amount of the second excitation coil 22, when a leakage exceeding this limit occurs, the focal length of the second magnetic field lens 20 can no longer be corrected.

In contrast, as illustrated in FIGS. 8 and 9, when the direction of the magnetic field B3 and the direction of the second magnetic field B2 are the same direction, excitation of the second excitation coil 22 is weakened. Therefore, even when the leakage of the magnetic field B3 is large, the focal length of the second magnetic field lens 20 can be corrected.

When the transmission electron microscope 1000 is a scanning transmission electron microscope, the objective lens 100 is mainly used to focus an electron beam and form an electron probe. In the objective lens 100, the lens that is important in terms of forming an electron probe is the first magnetic field lens 10 which creates the first magnetic field B1 that acts on an electron beam incident to the specimen S. Therefore, when the transmission electron microscope 1000 is a scanning transmission electron microscope, the direction of the magnetic field B3 and the direction of the first magnetic field B1 are made the same.

In this case, an amount of change of excitation of the first excitation coil 12 and an amount of change of excitation of the second excitation coil 22 are determined by the size and the direction of the magnetic field B3. Thus, a deviation of the focal length of the objective lens 100 caused by the magnetic field B3 is corrected by adjusting the excitation of the first excitation coil 12 and the excitation of the second excitation coil 22 in a state where the magnetic field B3 is actually being applied to a standard specimen. Excitation conditions of the first excitation coil 12 and the second excitation coil 22 at this point are recorded. This operation is repeated at different sizes and directions of the magnetic field B3. Based on excitation conditions obtained in this manner, a database of the excitation conditions of the first excitation coil 12 and the second excitation coil 22 is created. In the database, excitation conditions of the first excitation coil 12 and the second excitation coil 22 for correcting a deviation of the focal length of the objective lens 100 caused by the magnetic field B3 are registered for each size and each direction of the magnetic field B3. By referring to the database, the deviation of the focal length of the objective lens 100 caused by the magnetic field B3 can be readily corrected.

1.5. Processing

Figure 10:
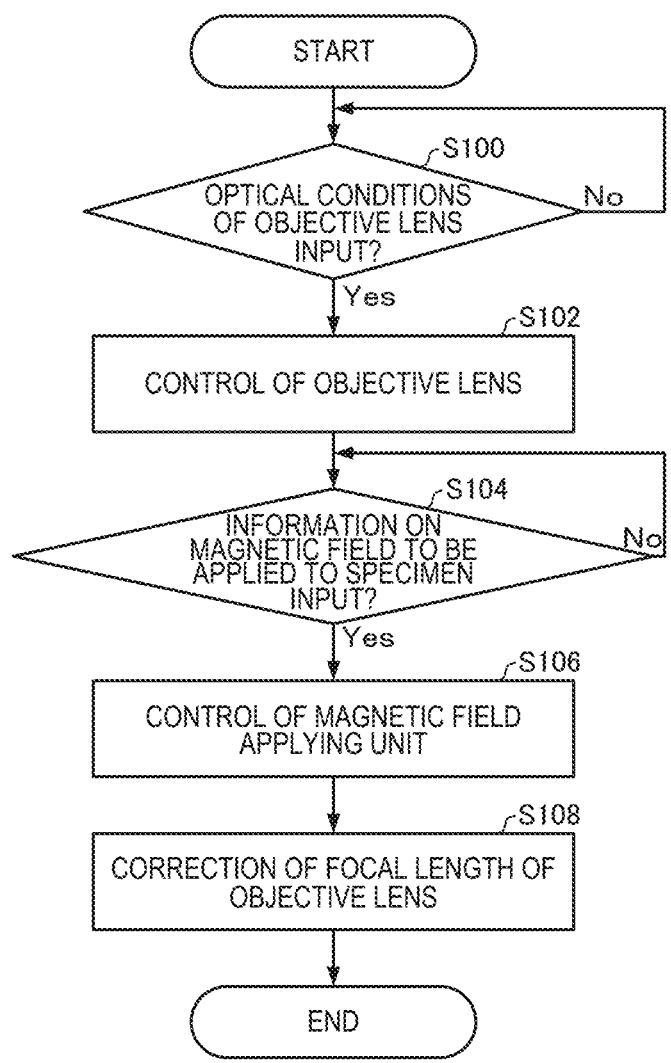
FIG. 10 is a flow chart illustrating an example of processing by a control unit of the transmission electron microscope according to the first embodiment.

Next, processing performed by the control unit 120 will be described. FIG. 10 is a flow chart illustrating an example of processing performed by the control unit 120 of the transmission electron microscope 1000.

First, the control unit 120 determines whether input of optical conditions of the objective lens 100 has been performed (S100) and stands by until input of optical conditions is performed (No in S100).

When the control unit 120 determines that input of optical conditions of the objective lens 100 has been performed (Yes in S100), the control unit 120 supplies a current to the first excitation coil 12 based on the input optical conditions and causes the first magnetic field lens 10 to generate the first magnetic field B1 and, at the same time, supplies a current to the second excitation coil 22 based on the input optical conditions and causes the second magnetic field lens 20 to generate the second magnetic field B2 (S102). Accordingly, a transmission electron microscope image is formed in the transmission electron microscope 1000.

Next, the control unit 120 determines whether information on the magnetic field B3 to be applied to the specimen S has been input (S104) and stands by until input of optical conditions is performed (No in S104). The information on the magnetic field B3 includes information on the size of the magnetic field B3 and the direction of the magnetic field B3.

When the control unit 120 determines that information on the magnetic field B3 has been input (Yes in S104), the control unit 120 generates the magnetic field B3 in a direction along the optical axis L on the specimen mounting surface 2 using the magnetic field applying unit 30 (S106). For example, the control unit 120 generates the magnetic field B3 by supplying a current to the first magnetic field applying coil 32*a* and the second magnetic field applying coil 32*b* based on the information on the magnetic field B3. Accordingly, the magnetic field B3 is applied to the specimen S.

Next, by changing excitations of the first excitation coil 12 and the second excitation coil 22, the control unit 120 corrects a deviation of the focal length of the objective lens 100 caused by the magnetic field B3 generated by the magnetic field applying unit 30 (S108). Accordingly, the deviation of the focal length of the objective lens 100 is corrected and a good transmission electron microscope image can be obtained in a state where the magnetic field B3 is applied to the specimen S.

In the storage unit 122, excitation conditions of the first excitation coil 12 and the second excitation coil 22 for correcting a deviation of the focal length of the objective lens 100 caused by the magnetic field B3 generated by the magnetic field applying unit 30 are stored for each size and each direction of the magnetic field B3. The control unit 120 reads excitation conditions of the first excitation coil 12 and the second excitation coil 22 in accordance with the size and the direction of the magnetic field B3 from the storage unit 122 and determines the excitation conditions of the first excitation coil 12 and the second excitation coil 22.

1.6. Features

For example, the method of controlling the transmission electron microscope 1000 has the following features.

The method of controlling the transmission electron microscope 1000 includes: a step of causing the first magnetic field lens 10 to generate the first magnetic field B1 and causing the second magnetic field lens 20 to generate the second magnetic field B2; a step of generating the magnetic field B3 in a direction along the optical axis L on the specimen mounting surface 2 using the magnetic field applying unit 30; and a step of correcting a deviation of a focal length of the objective lens 100 due to the magnetic field generated by the magnetic field applying unit 30 by changing excitations of the first excitation coil 12 and the second excitation coil 22. Consequently, according to the method of controlling the transmission electron microscope 1000, a deviation of the focal length of the objective lens 100 caused by the magnetic field B3 can be corrected. Therefore, a good transmission electron microscope image can be obtained in a state where an arbitrary magnetic field is applied to the specimen S.

For example, when the deviation of the focal length of the objective lens 100 caused by the magnetic field B3 is extremely large, a problem occurs in that an image cannot be formed within a movable range of the specimen S in the Z direction. According to the method of controlling the transmission electron microscope 1000, such a problem does not occur.

With the method of controlling the transmission electron microscope 1000, in the step of correcting a deviation of optical conditions of the objective lens 100, when the magnetic field B3 generated by the magnetic field applying unit 30 and the first magnetic field B1 are in the same direction, excitation of the first excitation coil 12 is weakened and excitation of the second excitation coil 22 is strengthened, but when the magnetic field B3 generated by the magnetic field applying unit 30 and the second magnetic field B2 are in the same direction, excitation of the first excitation coil 12 is strengthened and excitation of the second excitation coil 22 is weakened. Accordingly, the deviation of the focal length of the objective lens 100 caused by the magnetic field B3 can be corrected.

For example, the transmission electron microscope 1000 has the following features.

The transmission electron microscope 1000 performs: processing of causing the first magnetic field lens 10 to generate the first magnetic field B1 and causing the second magnetic field lens 20 to generate the second magnetic field B2; processing of generating the magnetic field B3 in a direction along the optical axis L on the specimen mounting surface 2 using the magnetic field applying unit 30; and processing of correcting a deviation of a focal length of the objective lens 100 caused by the magnetic field B3 generated by the magnetic field applying unit 30 by changing excitations of the first excitation coil 12 and the second excitation coil 22. Consequently, with the transmission electron microscope 1000, a deviation of the focal length of the objective lens 100 caused by the magnetic field B3 generated by the magnetic field applying unit 30 can be corrected. Therefore, with the transmission electron microscope 1000, a good transmission electron microscope image can be obtained in a state where an arbitrary magnetic field is applied to the specimen S.

The transmission electron microscope 1000 includes the storage unit 122 in which excitation conditions of the first excitation coil 12 and the second excitation coil 22 for correcting a deviation of the focal length of the objective lens 100 caused by the magnetic field B3 generated by the magnetic field applying unit 30 are stored for each size and each direction of the magnetic field B3 generated by the magnetic field applying unit 30. Consequently, with the transmission electron microscope 1000, a deviation of the focal length of the objective lens 100 caused by the magnetic field B3 can be readily corrected.

1.7. Modification of Objective Lens

Figure 11:
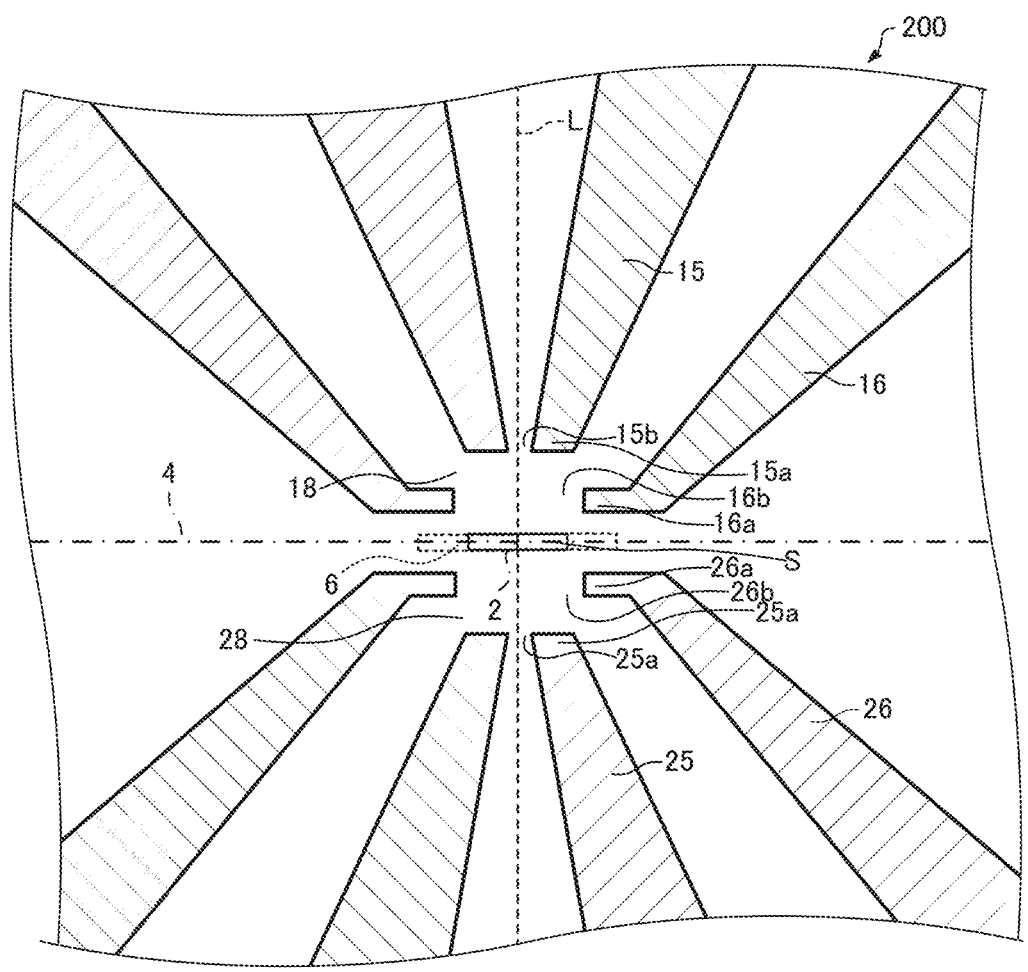
FIG. 11 is a sectional view schematically illustrating an objective lens according to a modification.

FIG. 11 is a sectional view schematically illustrating an objective lens 200 according to a modification.

In the objective lens 100 described above, when viewed from the direction along the optical axis L, the tip section 16*a* of the outer magnetic pole 16 and the tip section 15*a* of the inner magnetic pole 15 of the first magnetic field lens 10 overlap with each other as illustrated in FIG. 3. In a similar manner, when viewed from the direction along the optical axis L, the tip section 26*a* of the outer magnetic pole 26 and the tip section 25*a* of the inner magnetic pole 25 of the second magnetic field lens 20 overlap with each other.

By comparison, in the objective lens 200, when viewed from the direction along the optical axis L, the tip section 16*a* of the outer magnetic pole 16 and the tip section 15*a* of the inner magnetic pole 15 of the first magnetic field lens 10 do not overlap with each other as illustrated in FIG. 11. However, in the objective lens 200, when viewed from the direction along the optical axis L, the tip section 16*a* of the outer magnetic pole 16 of the first magnetic field lens 10 overlaps with the specimen movable region 6.

In a similar manner, in the objective lens 200, when viewed from the direction along the optical axis L, the tip section 26*a* of the outer magnetic pole 26 and the tip section 25*a* of the inner magnetic pole 25 of the second magnetic field lens 20 do not overlap with each other. However, in the objective lens 200, when viewed from the direction along the optical axis L, the tip section 26*a* of the outer magnetic pole 26 of the second magnetic field lens 20 overlaps with the specimen movable region 6.

In the objective lens 200, the magnetic fields generated by the first magnetic field lens 10 and the second magnetic field lens 20 can be prevented from leaking to a vicinity of the specimen S in a similar manner to the objective lens 100.

It should be noted that, in the objective lens 200, an effect of preventing the magnetic fields generated by the first magnetic field lens 10 and the second magnetic field lens 20 from leaking to the vicinity of the specimen S is smaller than that of the objective lens 100. However, with the objective lens 200, a size in a direction along the optical axis L of a space in which the specimen S is arranged can be widened as compared to the objective lens 100. Therefore, with the objective lens 200, the specimen S can be tilted by a greater angle.

2. Second Embodiment 2.1. Configuration of Transmission Electron Microscope

Next, a configuration of a transmission electron microscope according to a second embodiment will be described.

Figure 12:
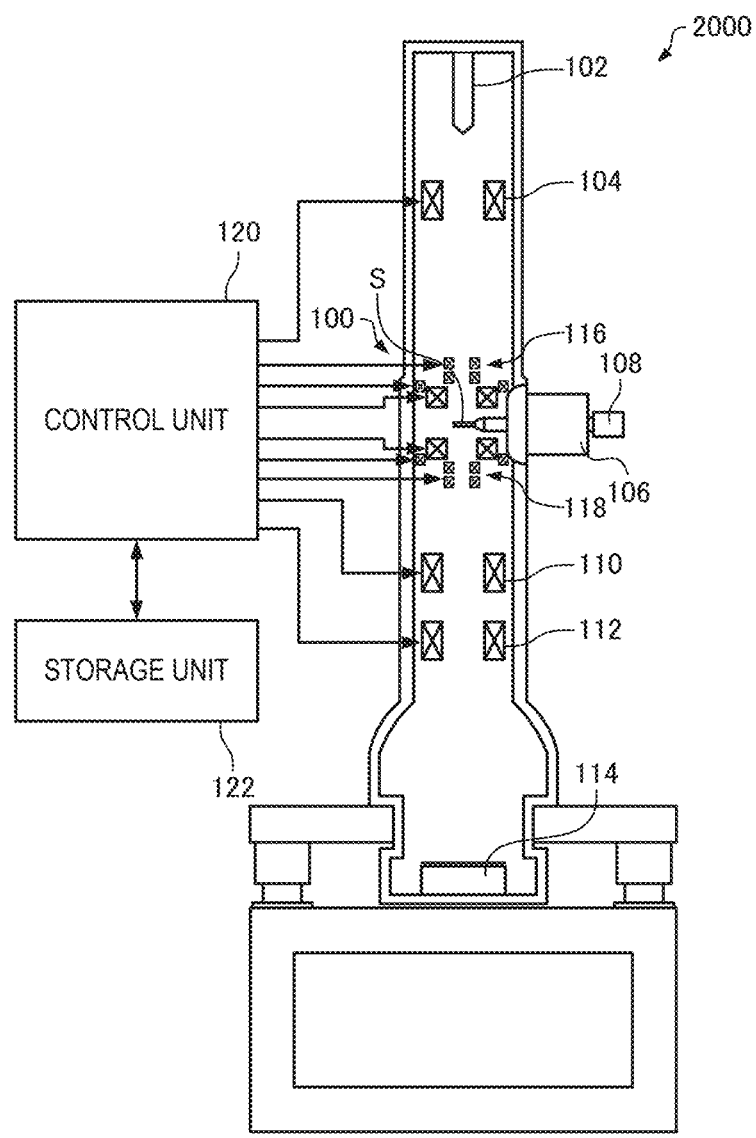
FIG. 12 is a diagram schematically illustrating a transmission electron microscope according to a second embodiment.
Figure 13:
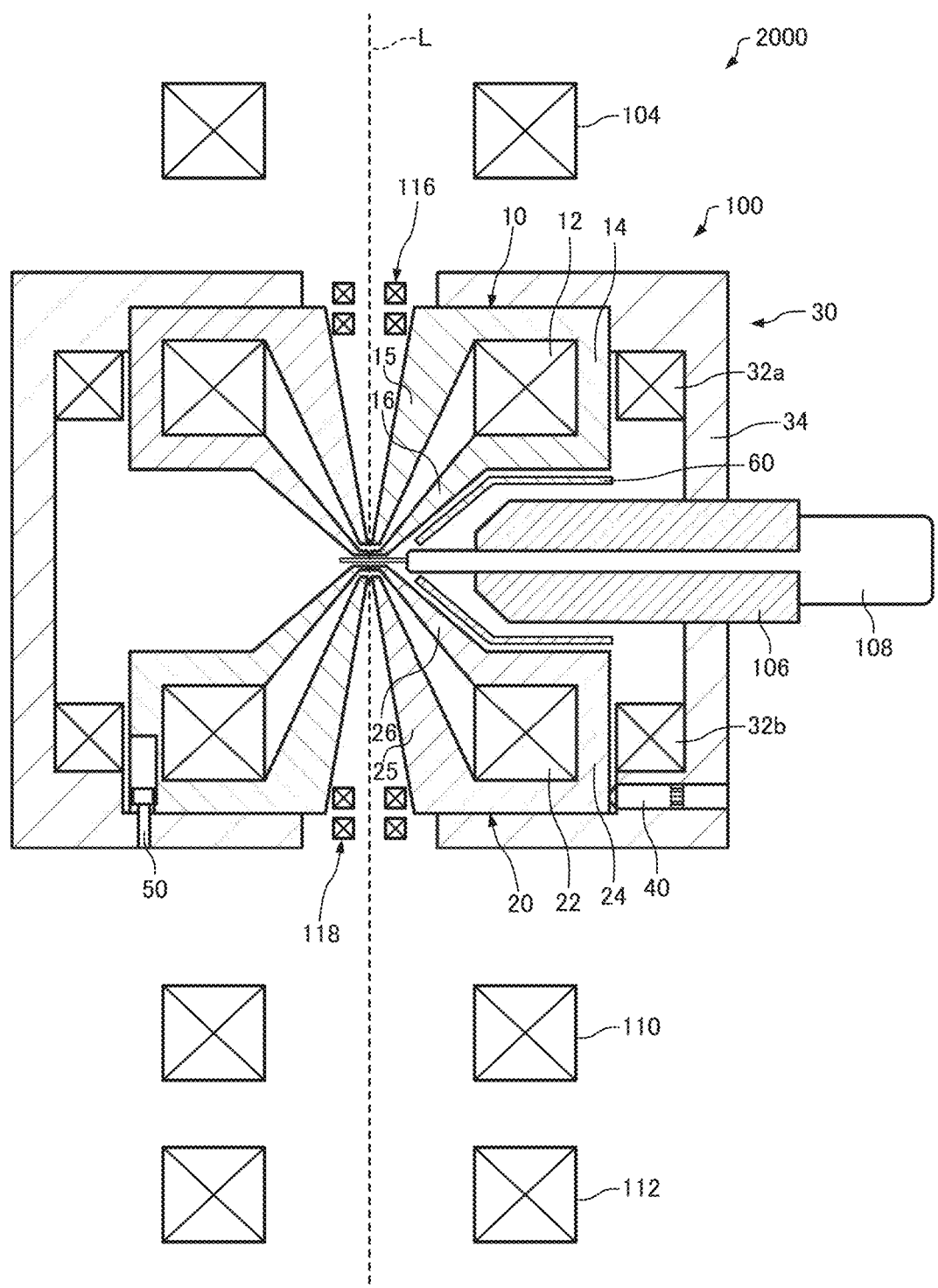
FIG. 13 is a diagram schematically illustrating substantial parts of the transmission electron microscope according to the second embodiment.

FIG. 12 is a diagram schematically illustrating a transmission electron microscope 2000 according to the second embodiment. FIG. 13 is a diagram schematically illustrating substantial parts of the transmission electron microscope 2000 according to the second embodiment. Hereinafter, in the transmission electron microscope 2000 according to the second embodiment, members having similar functions to the components of the transmission electron microscope 1000 according to the first embodiment will be denoted by same reference characters and a detailed description thereof will be omitted.

As illustrated in FIGS. 12 and 13, the transmission electron microscope 2000 includes a first alignment coil 116 and a second alignment coil 118. In addition, in the transmission electron microscope 2000, the control unit 120 controls the illumination lens 104, the objective lens 100, the first alignment coil 116, the second alignment coil 118, the intermediate lens 110, and the projector lens 112.

The first alignment coil 116 and the second alignment coil 118 are arranged along the optical axis L so as to sandwich the specimen mounting surface 2 (refer to FIG. 3 and the like). In the illustrated example, the first alignment coil 116 is arranged between the illumination lens 104 and the specimen mounting surface 2. The second alignment coil 118 is arranged between the specimen mounting surface 2 and the intermediate lens 110. The first alignment coil 116 is constituted by, for example, two coils arranged along the optical axis L. The second alignment coil 118 is constituted by, for example, two coils arranged along the optical axis L.

2.2. Control Method of Transmission Electron Microscope

Next, a method of controlling the transmission electron microscope 2000 will be described. The following description will focus on points that differ from the method of controlling the transmission electron microscope 1000 described above, and description of similar points will be omitted.

In the transmission electron microscope 1000 described above, a deviation of the focal length of the objective lens 100 caused by the magnetic field B3 is corrected by changing excitations of the first excitation coil 12 and the second excitation coil 22.

However, there are cases where, even by changing the excitations of the first excitation coil 12 and the second excitation coil 22, a deviation of the optical conditions of the objective lens 100 caused by the magnetic field B3 cannot be completely corrected.

(1) Correction of Axial Deviation

There are cases where an axial deviation caused by the magnetic field B3 cannot be corrected even by changing excitations of the first excitation coil 12 and the second excitation coil 22. In this case, an axial deviation refers to a phenomenon in which an electron beam does not coincide with the optical axis L and deviates from the optical axis L. When an axial deviation caused by the magnetic field B3 occurs, a deviation of a field of view or a deviation of an aberration occurs.

Therefore, in the transmission electron microscope 2000, an axial deviation is corrected using the first alignment coil 116 and the second alignment coil 118. Specifically, by deflecting an electron beam with the first alignment coil 116 and the second alignment coil 118, an axial deviation caused by the magnetic field B3 is corrected.

(2) Correction of Magnification

There are cases where a deviation of magnification cannot be corrected even by changing excitations of the first excitation coil 12 and the second excitation coil 22. In other words, there are cases where a deviation of magnification occurs between before generating the magnetic field B3 and after generating the magnetic field B3. Therefore, in the transmission electron microscope 2000, a deviation of magnification caused by the magnetic field B3 is corrected by changing excitation conditions of the intermediate lens 110 and the projector lens 112.

(3) Correction of Rotation of Image

There are cases where a rotation of an image cannot be corrected even by changing excitations of the first excitation coil 12 and the second excitation coil 22. In other words, there are cases where applying the magnetic field B3 causes an image to rotate. A rotation of an image is, for example, a rotation of the image with a center of the image as a rotational axis. For example, when the image rotates by 180 degrees, top and bottom of the image are inverted.

In the transmission electron microscope 2000, a rotation of an image caused by the magnetic field B3 is corrected by changing excitation conditions of the intermediate lens 110 and the projector lens 112.

(4) Correction of Camera Length

There are cases where a deviation of a camera length cannot be corrected even by changing excitations of the first excitation coil 12 and the second excitation coil 22. In other words, there are cases where a change of the camera length occurs between before applying the magnetic field B3 and after applying the magnetic field B3.

In the transmission electron microscope 2000, a deviation of the camera length caused by the magnetic field B3 is corrected by changing excitation conditions of the intermediate lens 110 and the projector lens 112.

(5) Correction by Illumination Lens

When a deviation of optical conditions of the objective lens 100 caused by the magnetic field B3 cannot be completely corrected even by changing excitations of the first excitation coil 12 and the second excitation coil 22, a deviation of the optical conditions of the objective lens 100 which cannot be corrected by changing excitations of the excitations of the first excitation coil 12 and the second excitation coil 22 may be corrected by changing excitation conditions of the illumination lens 104.

2.3. Processing

Figure 14:
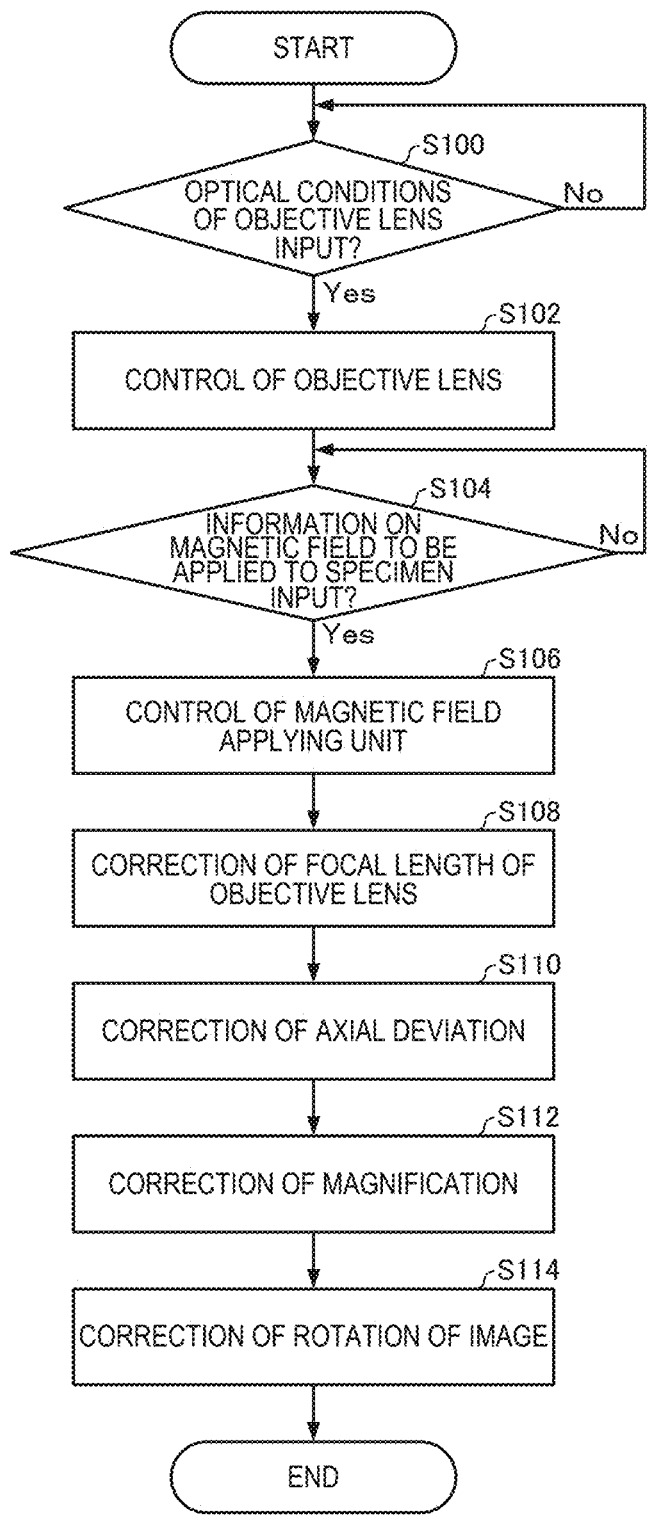
FIG. 14 is a flow chart illustrating an example of processing by a control unit of the transmission electron microscope according to the second embodiment.

Next, processing performed by the control unit 120 will be described. FIG. 14 is a flow chart illustrating an example of processing performed by the control unit 120 of the transmission electron microscope 2000. It should be noted that, in FIG. 14, steps of performing the same processing as those of FIG. 10 are denoted by same reference characters. Hereinafter, descriptions of such steps of performing the same processing as those of FIG. 10 will be omitted.

After correcting a deviation of the focal length of the objective lens 100 caused by the magnetic field B3, the control unit 120 corrects an axial deviation using the first alignment coil 116 and the second alignment coil 118 (S110).

Next, the control unit 120 corrects a deviation of magnification caused by the magnetic field B3 by changing excitation conditions of the intermediate lens 110 and the projector lens 112 (S112).

Next, the control unit 120 corrects a rotation of an image caused by the magnetic field B3 by changing excitation conditions of the intermediate lens 110 and the projector lens 112 (S114). Accordingly, the deviation of optical conditions caused by the magnetic field B3 is corrected and a good transmission electron microscope image can be obtained in a state where the magnetic field B3 is applied to the specimen S.

In this case, the excitation conditions of the first excitation coil 12 and the second excitation coil 22, the excitation conditions of the first alignment coil 116 and the second alignment coil 118, and the excitation conditions of the intermediate lens 110 and the projector lens 112 are determined by the size and the direction of the magnetic field B3.

For this reason, the storage unit 122 stores, for each size and size of the magnetic field B3, the excitation conditions of the first excitation coil 12 and the second excitation coil 22, the excitation conditions of the first alignment coil 116 and the second alignment coil 118, and the excitation conditions of the intermediate lens 110 and the projector lens 112 for correcting a deviation of the optical conditions caused by the magnetic field B3. The control unit 120 reads the excitation conditions of the first excitation coil 12 and the second excitation coil 22, the excitation conditions of the first alignment coil 116 and the second alignment coil 118, and the excitation conditions of the intermediate lens 110 and the projector lens 112 in accordance with the size and the direction of the magnetic field B3 from the storage unit 122 and determines the excitation conditions.

While a case where processing is performed in the order of step S110, step S112, and step S114 has been described above, this order is not particularly limited.

2.4. Features

For example, the method of controlling the transmission electron microscope 2000 has the following features.

The method of controlling the transmission electron microscope 2000 further includes a step of correcting an axial deviation of an electron beam with respect to the optical axis L caused by the magnetic field B3 by deflecting the electron beam with the first alignment coil 116 and the second alignment coil 118. Consequently, according to the method of controlling the transmission electron microscope 2000, an axial deviation caused by the magnetic field B3 can be corrected.

The method of controlling the transmission electron microscope 2000 further includes a step of correcting a deviation of magnification caused by the magnetic field B3 by changing excitation conditions of the intermediate lens 110 and the projector lens 112. Consequently, according to the method of controlling the transmission electron microscope 2000, a deviation of magnification caused by the magnetic field B3 can be corrected.

The method of controlling the transmission electron microscope 2000 further includes a step of correcting a rotation of an image caused by the magnetic field B3 by changing the excitation conditions of the intermediate lens 110 and the projector lens 112. Consequently, according to the method of controlling the transmission electron microscope 2000, a rotation of an image caused by the magnetic field B3 can be corrected.

3. Third Embodiment

3.1. Configuration of Transmission Electron Microscope

Figure 15:
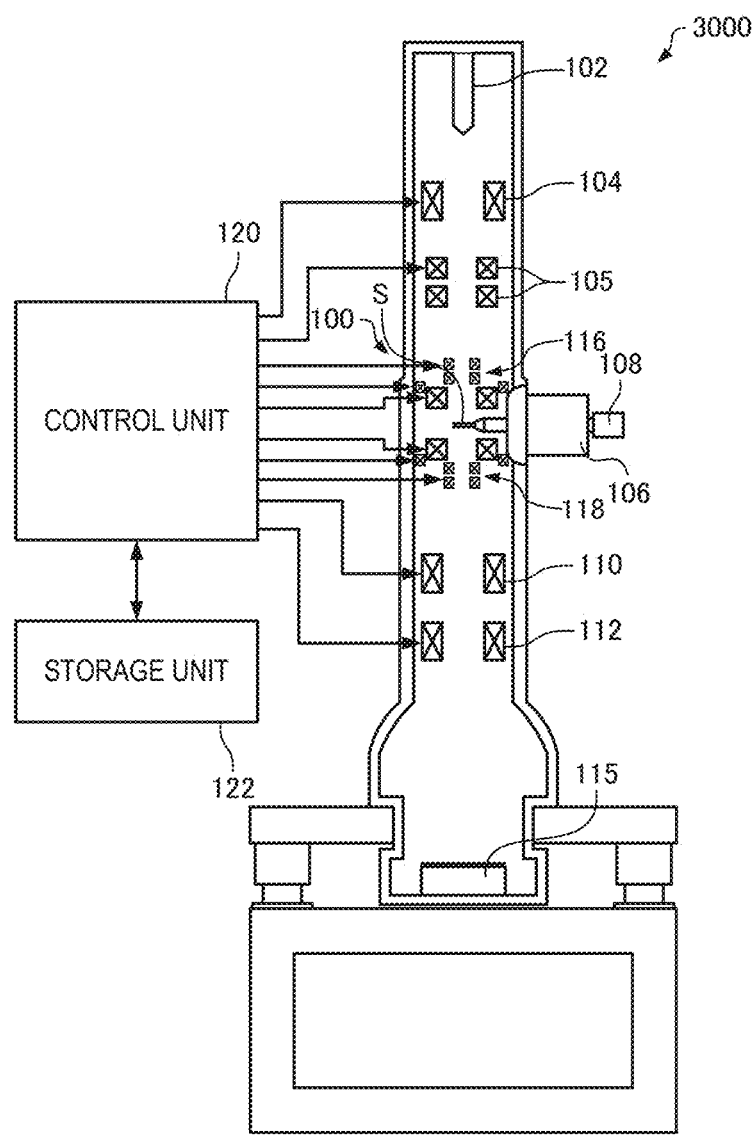
FIG. 15 is a diagram illustrating a configuration of a transmission electron microscope according to a third embodiment.

Next, a transmission electron microscope according to a third embodiment will be described. FIG. 15 is a diagram illustrating a configuration of a transmission electron microscope 3000 according to the third embodiment. Hereinafter, in the transmission electron microscope 3000 according to the third embodiment, members having similar functions to the components of the transmission electron microscope 1000 according to the first embodiment and the transmission electron microscope 2000 according to the second embodiment will be denoted by same reference characters and a detailed description thereof will be omitted.

As illustrated in FIG. 15, the transmission electron microscope 3000 includes a scanning coil 105 for scanning a surface of the specimen S with an electron beam and a detector 115 for detecting electrons having been transmitted through the specimen S. In other words, the transmission electron microscope 3000 is a scanning transmission electron microscope.

In the transmission electron microscope 3000, an electron beam discharged from the electron source 102 is focused by the illumination lens 104 and the objective lens 100 to form an electron probe and illuminate the specimen S. An electron beam to illuminate the specimen S is caused to scan a surface of the specimen S by the scanning coil 105. An electron beam having been transmitted through the specimen S is guided to the detector 115 by the objective lens 100, the intermediate lens 110, and the projector lens 112, and is detected by the detector 115. A detection signal of the detector 115 is associated with information on an illumination position on the specimen S. Accordingly, a scanning transmission electron microscope image can be acquired.

A magnification of the scanning transmission electron microscope image is determined by a size of a region having been scanned by an electron beam. In addition, a direction of the scanning transmission electron microscope image is determined by a scanning direction.

The control unit 120 controls the scanning coil 105.

3.2. Control Method of Transmission Electron Microscope

Next, a method of controlling the transmission electron microscope 3000 will be described. The following description will focus on points that differ from the method of controlling the transmission electron microscope 1000 and the method of controlling the transmission electron microscope 2000 described above, and description of similar points will be omitted.

In the transmission electron microscope 2000 described above, a deviation of magnification caused by the magnetic field B3 is corrected by changing excitation conditions of the intermediate lens 110 and the projector lens 112.

By comparison, in the transmission electron microscope 3000, a deviation of magnification caused by the magnetic field B3 is corrected by changing, using the scanning coil 105, a size of a region to be scanned by an electron beam.

In addition, in the transmission electron microscope 2000 described above, a rotation of an image caused by the magnetic field B3 is corrected by changing excitation conditions of the intermediate lens 110 and the projector lens 112.

By comparison, in the transmission electron microscope 3000, a rotation of an image caused by the magnetic field B3 is corrected by changing a scanning direction using the scanning coil 105.

3.3. Processing

Processing performed by the control unit 120 of the transmission electron microscope 3000 is the same as the processing performed by the control unit 120 of the transmission electron microscope 2000 with the exception of using the scanning coil 105 in the processing of correcting a magnification (S112) and the processing of correcting a rotation of an image (S114) illustrated in FIG. 14, and descriptions of the processing will be omitted.

3.4. Features

The method of controlling the transmission electron microscope 3000 further includes a step of correcting a deviation of magnification caused by the magnetic field B3 by changing, using the scanning coil 105, a size of a region to be scanned by an electron beam. Consequently, according to the method of controlling the transmission electron microscope 3000, a deviation of magnification caused by the magnetic field B3 can be corrected.

The method of controlling the transmission electron microscope 3000 further includes a step of correcting a rotation of an image caused by the magnetic field B3 by changing, using the scanning coil 105, a scanning direction of an electron beam. Consequently, according to the method of controlling the transmission electron microscope 3000, a rotation of an image caused by the magnetic field B3 can be corrected.

The invention includes configurations that are substantially the same (for example, in function, method, and results, or in objective and effects) as the configurations described in the embodiments. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. A method of controlling a transmission electron microscope that comprises an objective lens, the objective lens comprising:

a first magnetic field lens and a second magnetic field lens which are arranged along an optical axis so as to sandwich a specimen mounting surface on which a specimen is to be mounted; and a magnetic field generator which generates a magnetic field of a direction along the optical axis on the specimen mounting surface, the first magnetic field lens having a first inner magnetic pole, a first outer magnetic pole, and a first excitation coil, the second magnetic field lens having a second inner magnetic pole, a second outer magnetic pole, and a second excitation coil, a distance between a tip section of the first outer magnetic pole and the specimen mounting surface being shorter than a distance between a tip section of the first inner magnetic pole and the specimen mounting surface, a distance between a tip section of the second outer magnetic pole and the specimen mounting surface being shorter than a distance between a tip section of the second inner magnetic pole and the specimen mounting surface, the first magnetic field lens generating a first magnetic field by exciting the first excitation coil to cause a magnetic flux to leak from a gap between the first inner magnetic pole and the first outer magnetic pole, the second magnetic field lens generating a second magnetic field by exciting the second excitation coil to cause a magnetic flux to leak from a gap between the second inner magnetic pole and the second outer magnetic pole, and a direction of a component of the first magnetic field along the optical axis and a direction of a component of the second magnetic field along the optical axis being opposite to each other, the method of controlling a transmission electron microscope comprising:

causing the first magnetic field lens to generate the first magnetic field and causing the second magnetic field lens to generate the second magnetic field;

causing the magnetic field generator to generate a magnetic field of a direction along the optical axis on the specimen mounting surface; and changing excitations of the first excitation coil and the second excitation coil to correct a deviation of a focal length of the objective lens, the deviation being caused by the magnetic field generated by the magnetic field generator.

2. The method of controlling a transmission electron microscope according to claim 1, wherein in correcting a deviation of a focal length of the objective lens, when the direction of the magnetic field generated by the magnetic field generator is the same as the direction of the first magnetic field, excitation of the first excitation coil is weakened and excitation of the second excitation coil is strengthened, and when the direction of the magnetic field generated by the magnetic field generator is the same as the direction of the second magnetic field, excitation of the first excitation coil is strengthened and excitation of the second excitation coil is weakened.

3. The method of controlling a transmission electron microscope according to claim 1, wherein the transmission electron microscope further comprises a first alignment coil and a second alignment coil arranged along the optical axis so as to sandwich the specimen mounting surface, and the method of controlling a transmission electron microscope further comprises: correcting an axial deviation of an electron beam with respect to the optical axis by deflecting an electron beam with the first alignment coil and the second alignment coil, the axial deviation being caused by the magnetic field generated by the magnetic field generator.

4. The method of controlling a transmission electron microscope according to claim 1, wherein the transmission electron microscope further comprises an intermediate lens and a projector lens, the objective lens, the intermediate lens, and the projector lens constitute an imaging system of the transmission electron microscope, and the method of controlling a transmission electron microscope further comprises: correcting a deviation of magnification by changing excitation conditions of the intermediate lens and the projector lens, the deviation of magnification being caused by the magnetic field generated by the magnetic field generator.

5. The method of controlling a transmission electron microscope according to claim 1, wherein the transmission electron microscope includes a scanning coil used for scanning a surface of the specimen with an electron beam, and the method of controlling a transmission electron microscope further comprises correcting a deviation of magnification by changing a size of a region of the specimen to be scanned with an electron beam by using the scanning coil, the deviation of magnification being caused by the magnetic field generated by the magnetic field generator.

6. A transmission electron microscope comprising:

an objective lens; and a control unit that controls the objective lens, the objective lens comprising:

a first magnetic field lens and a second magnetic field lens which are arranged along an optical axis so as to sandwich a specimen mounting surface on which a specimen is to be mounted; and a magnetic field generator which generates a magnetic field of a direction along the optical axis on the specimen mounting surface, the first magnetic field lens having a first inner magnetic pole, a first outer magnetic pole, and a first excitation coil, the second magnetic field lens having a second inner magnetic pole, a second outer magnetic pole, and a second excitation coil, a distance between a tip section of the first outer magnetic pole and the specimen mounting surface being shorter than a distance between a tip section of the first inner magnetic pole and the specimen mounting surface, a distance between a tip section of the second outer magnetic pole and the specimen mounting surface being shorter than a distance between a tip section of the second inner magnetic pole and the specimen mounting surface, the first magnetic field lens generating a first magnetic field by exciting the first excitation coil to cause a magnetic flux to leak from a gap between the first inner magnetic pole and the first outer magnetic pole, the second magnetic field lens generating a second magnetic field by exciting the second excitation coil to cause a magnetic flux to leak from a gap between the second inner magnetic pole and the second outer magnetic pole, and a direction of a component of the first magnetic field along the optical axis and a direction of a component of the second magnetic field along the optical axis being opposite to each other, and the control unit performing:

processing of causing the first magnetic field lens to generate the first magnetic field and causing the second magnetic field lens to generate the second magnetic field;

processing of causing the magnetic field generator to generating a magnetic field of a direction along the optical axis on the specimen mounting surface; and processing of changing excitations of the first excitation coil and the second excitation coil to correct a deviation of a focal length of the objective lens, the deviation being caused by the magnetic field generated by the magnetic field generator.

7. The transmission electron microscope according to claim 6, comprising
a storage unit in which excitation conditions of the first excitation coil and the second excitation coil for correcting a deviation of a focal length of the objective lens are stored for each size and each direction of the magnetic field generated by the magnetic field generator, the deviation being caused by a magnetic field generated by the magnetic field generator.

* * * * *